(12) United States Patent
Li et al.

(10) Patent No.: US 12,310,074 B2
(45) Date of Patent: May 20, 2025

(54) NANOSTRUCTURE FIELD-EFFECT TRANSISTOR DEVICE AND METHODS OF FORMING

(71) Applicant: Taiwan Semiconductor Manufacturing Co., Ltd., Hsinchu (TW)

(72) Inventors: Yi-Shao Li, Hsinchu (TW); Shu-Han Chen, Hsinchu (TW); Chun-Heng Chen, Hsinchu (TW); Chi On Chui, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 518 days.

(21) Appl. No.: 17/717,839

(22) Filed: Apr. 11, 2022

(65) Prior Publication Data
US 2023/0138136 A1 May 4, 2023

Related U.S. Application Data

(60) Provisional application No. 63/275,518, filed on Nov. 4, 2021.

(51) Int. Cl.
*H10D 62/10* (2025.01)
*H10D 30/67* (2025.01)
(Continued)

(52) U.S. Cl.
CPC ....... *H10D 62/118* (2025.01); *H10D 30/6713* (2025.01); *H10D 30/6735* (2025.01);
(Continued)

(58) Field of Classification Search
CPC ......... H01L 29/0665; H01L 21/823412; H01L 21/823418; H01L 21/823431;
(Continued)

(56) References Cited

U.S. PATENT DOCUMENTS

| 9,209,247 B2 | 12/2015 | Colinge et al. |
| 9,224,833 B2 | 12/2015 | Chen et al. |

(Continued)

FOREIGN PATENT DOCUMENTS

| TW | 200832513 A | 8/2008 |
| TW | 202139462 A | 10/2021 |
| TW | 202141655 A | 11/2021 |

*Primary Examiner* — Karen Kusumakar
*Assistant Examiner* — Shawn Shaw Muslim
(74) *Attorney, Agent, or Firm* — Slater Matsil, LLP

(57) ABSTRACT

A method of forming a nanostructure field-effect transistor (nano-FET) device includes: forming a fin structure that includes a fin and alternating layers of a first semiconductor material and a second semiconductor material overlying the fin; forming a dummy gate structure over the fin structure; forming source/drain regions over the fin structure on opposing sides of the dummy gate structure; removing the dummy gate structure to expose the first and second semiconductor materials under the dummy gate structure; selectively removing the exposed first semiconductor material, where after the selectively removing, the exposed second semiconductor material remains to form nanostructures, where different surfaces of the nanostructures have different atomic densities of the second semiconductor material; forming a gate dielectric layer around the nanostructures, thicknesses of the gate dielectric layer on the different surfaces of the nanostructures being formed substantially the same; and forming a gate electrode around the gate dielectric layer.

20 Claims, 40 Drawing Sheets

(51) Int. Cl.
*H10D 64/01* (2025.01)
*H10D 84/01* (2025.01)
*H10D 84/03* (2025.01)

(52) U.S. Cl.
CPC ....... *H10D 30/6757* (2025.01); *H10D 64/017* (2025.01); *H10D 84/0128* (2025.01); *H10D 84/013* (2025.01); *H10D 84/0158* (2025.01); *H10D 84/038* (2025.01)

(58) Field of Classification Search
CPC ......... H01L 29/42392; H01L 29/66545; H01L 29/78618; H01L 29/78696; H01L 21/02164; H01L 21/02238; H01L 21/02252; H01L 21/02255; H01L 21/0228; H01L 29/045; H01L 29/0847; H01L 29/0673; H01L 29/66439; H01L 21/28167; H01L 21/823807; H01L 21/823857; H01L 27/092; H01L 29/165; H01L 29/775; H01L 29/7848; B82Y 10/00

See application file for complete search history.

(56) References Cited

U.S. PATENT DOCUMENTS

| | | |
|---|---|---|
| 9,251,888 B1 | 2/2016 | Liaw |
| 9,349,900 B2 | 5/2016 | Rogers et al. |
| 11,227,956 B2 | 1/2022 | Yeong et al. |
| 11,342,326 B2 | 5/2022 | Chiu et al. |
| 2010/0252800 A1* | 10/2010 | Chidambarrao .... H01L 29/0665 977/762 |
| 2015/0048442 A1 | 2/2015 | Colinge et al. |
| 2015/0303270 A1 | 10/2015 | Liaw |
| 2018/0315857 A1* | 11/2018 | Li ..................... H01L 29/66818 |
| 2019/0221427 A1* | 7/2019 | Lo ....................... H01J 37/3244 |
| 2020/0006155 A1* | 1/2020 | Chiang ........... H01L 21/823864 |

\* cited by examiner

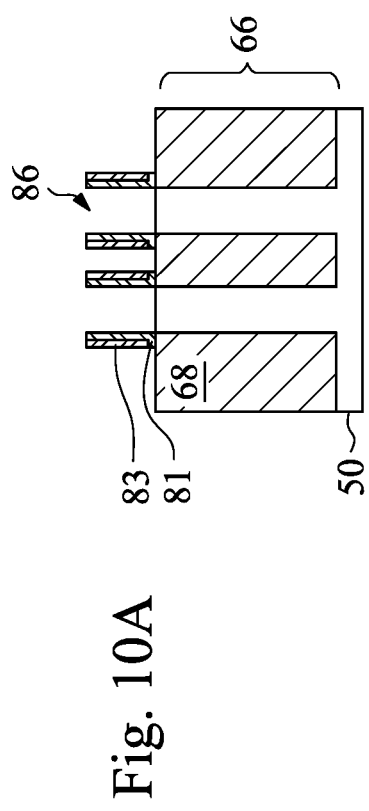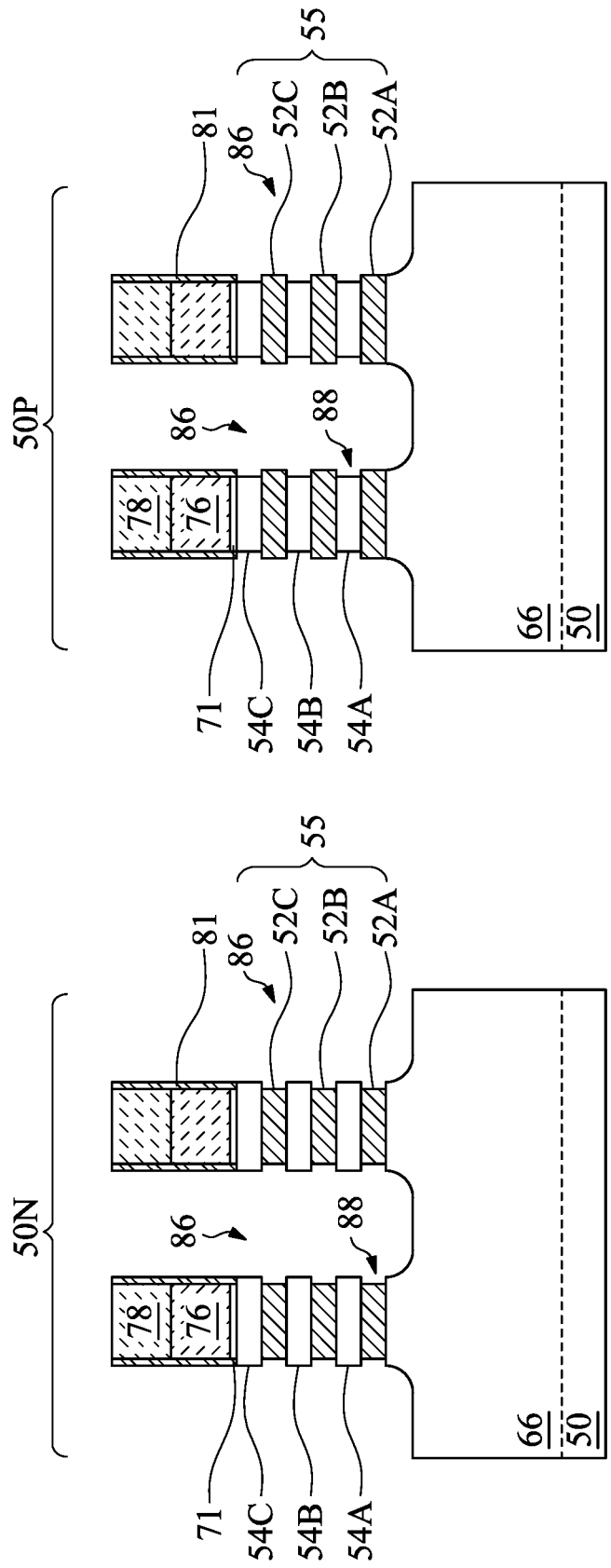
Fig. 10A
Fig. 10B

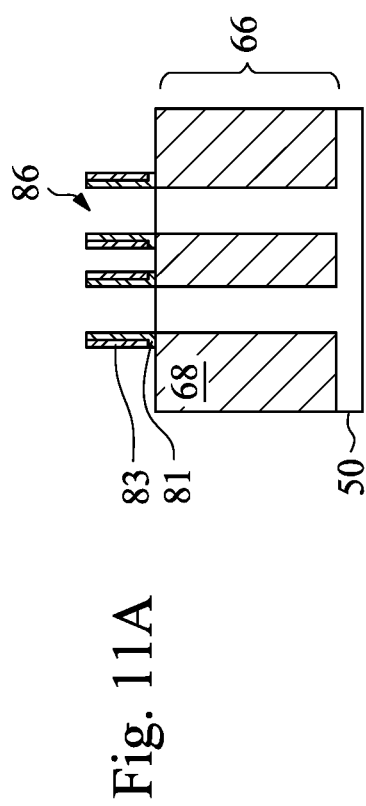
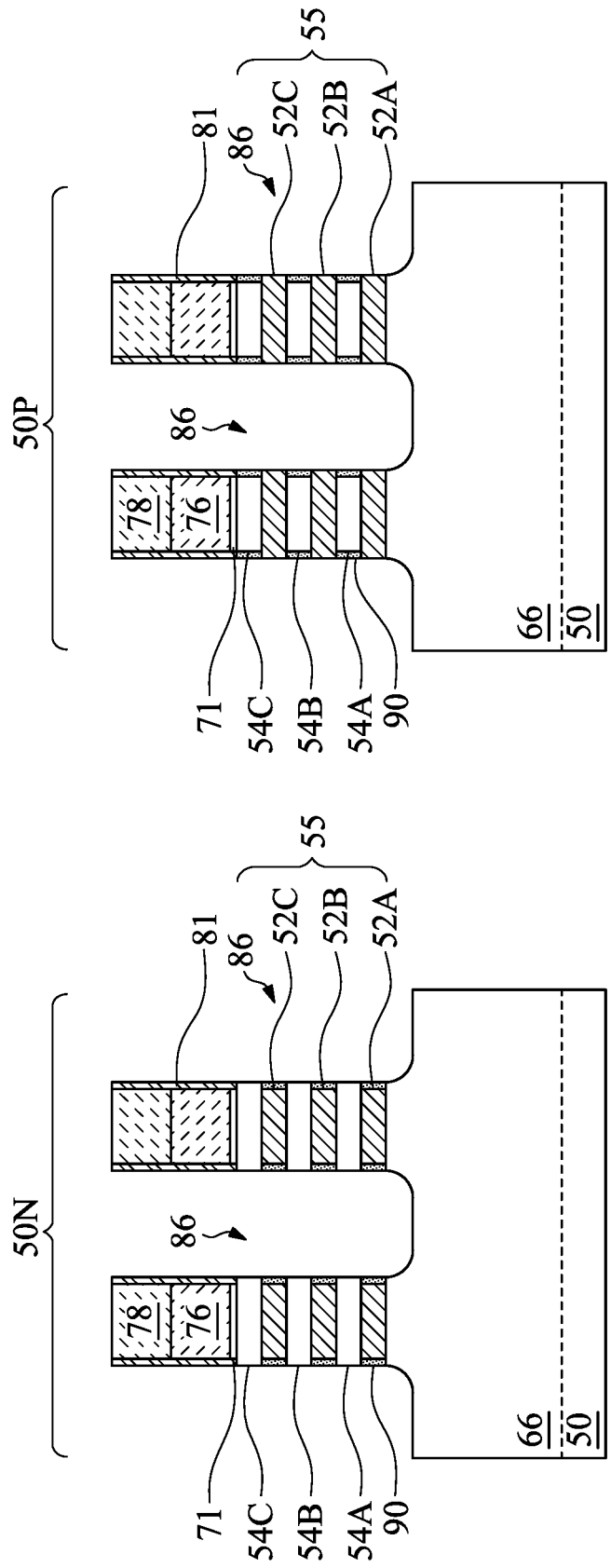
Fig. 11A
Fig. 11B

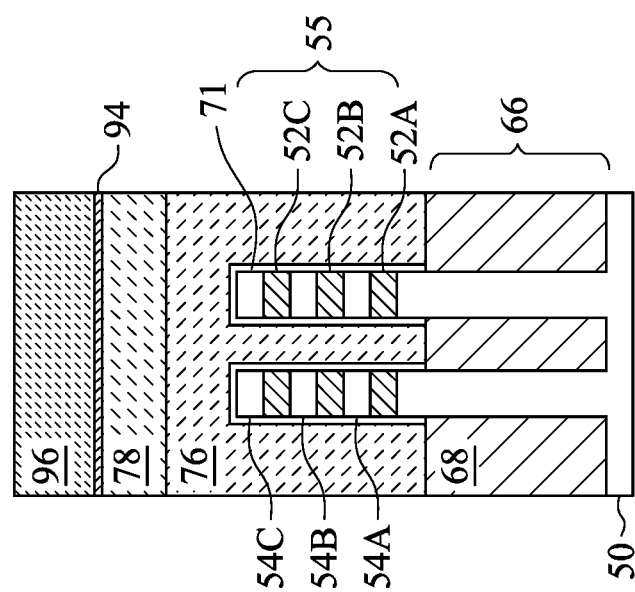

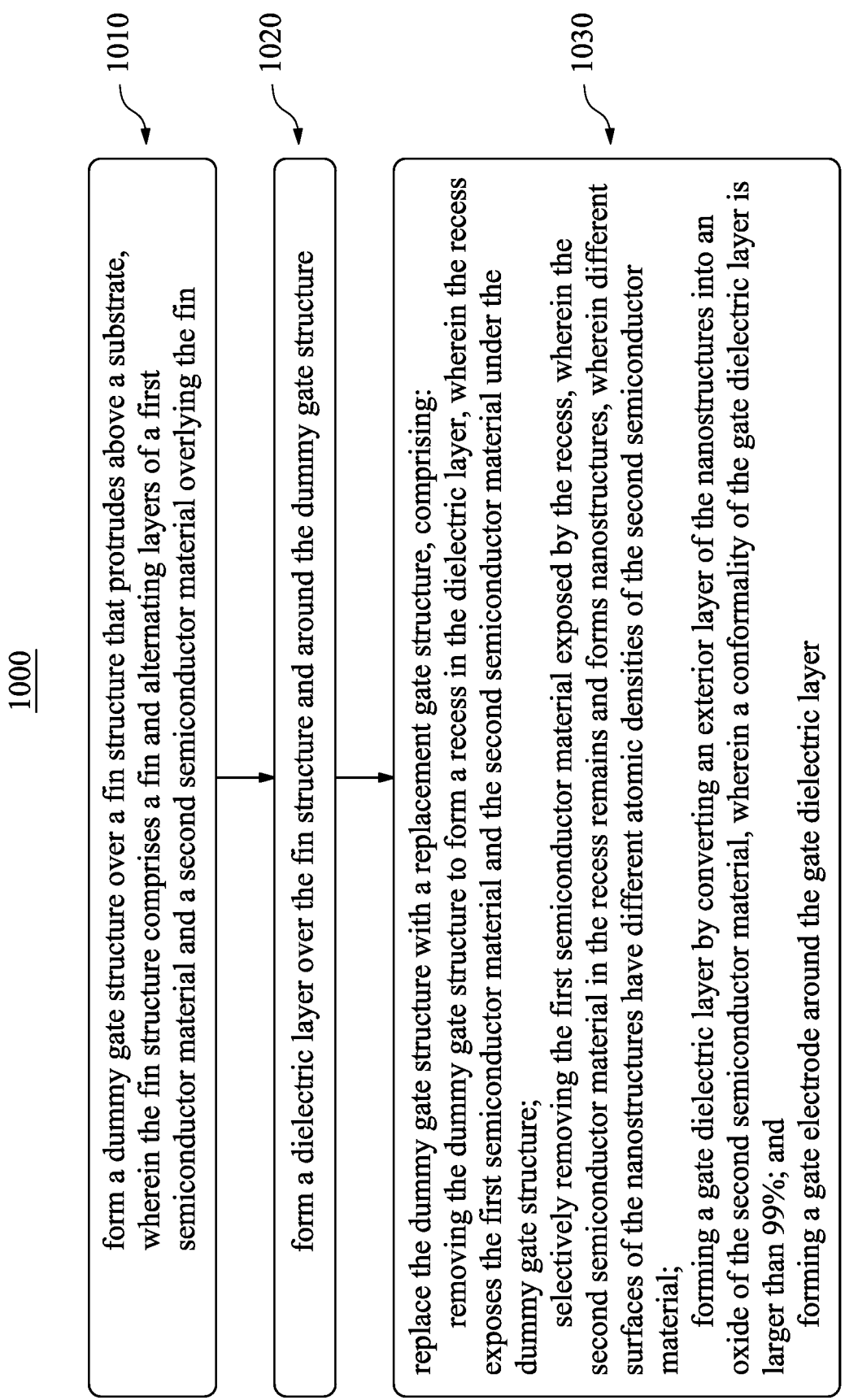

NANOSTRUCTURE FIELD-EFFECT TRANSISTOR DEVICE AND METHODS OF FORMING

PRIORITY CLAIM AND CROSS-REFERENCE

This application claims priority to U.S. Provisional Patent Application No. 63/275,518, filed Nov. 4, 2021, entitled "Method for Forming Semiconductor Device Structure," which application is hereby incorporated by reference in its entirety.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6A, 6B, 7A, 7B, 8A, 8B, 9A, 9B, 10A, 10B, 11A, 11B, 11C, 12A, 12B, 12C, 12D, 13A, 13B, 13C, 14A, 14B, 15A, 15B, 16A, 16B, 17A, 17B, 17C, 18A, 18B, 19A, 19B, 19C, 20A, 20B, 20C, 21A, 21B, and 21C are cross-sectional views of intermediate stages in the manufacturing of nano-FETs, in accordance with an embodiment.

FIG. 23 is a flow chart of a method of forming a nano-FET, in some embodiments.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a gate dielectric layer having a substantially uniform thickness (e.g., with conformality larger than 99%) is formed around nanostructures (e.g., nanosheets, or nanowires) of a nano-FET device. The semiconductor material (e.g., Si) of the nanostructures has different crystal orientations at different surfaces of the nanostructures, and have different atomic densities of the semiconductor material of the nanostructures at the different surfaces of the nanostructures. In some embodiments, in order to overcome the different atomic densities and achieve a substantially uniform thickness for the gate dielectric layer, oxygen radicals are used in an oxidization process to conver an exterior layer of the nanostructures into an oxide (e.g., $SiO_2$) of the semiconductor material of the nanostructures. In some embodiments, the energy level E of the oxygen radicals are controlled to be below a certain level (e.g., $0<E<2$ eV) to achieve a substantially uniform thickness for the gate dielectric layer (e.g., the oxide).

Figure 1:
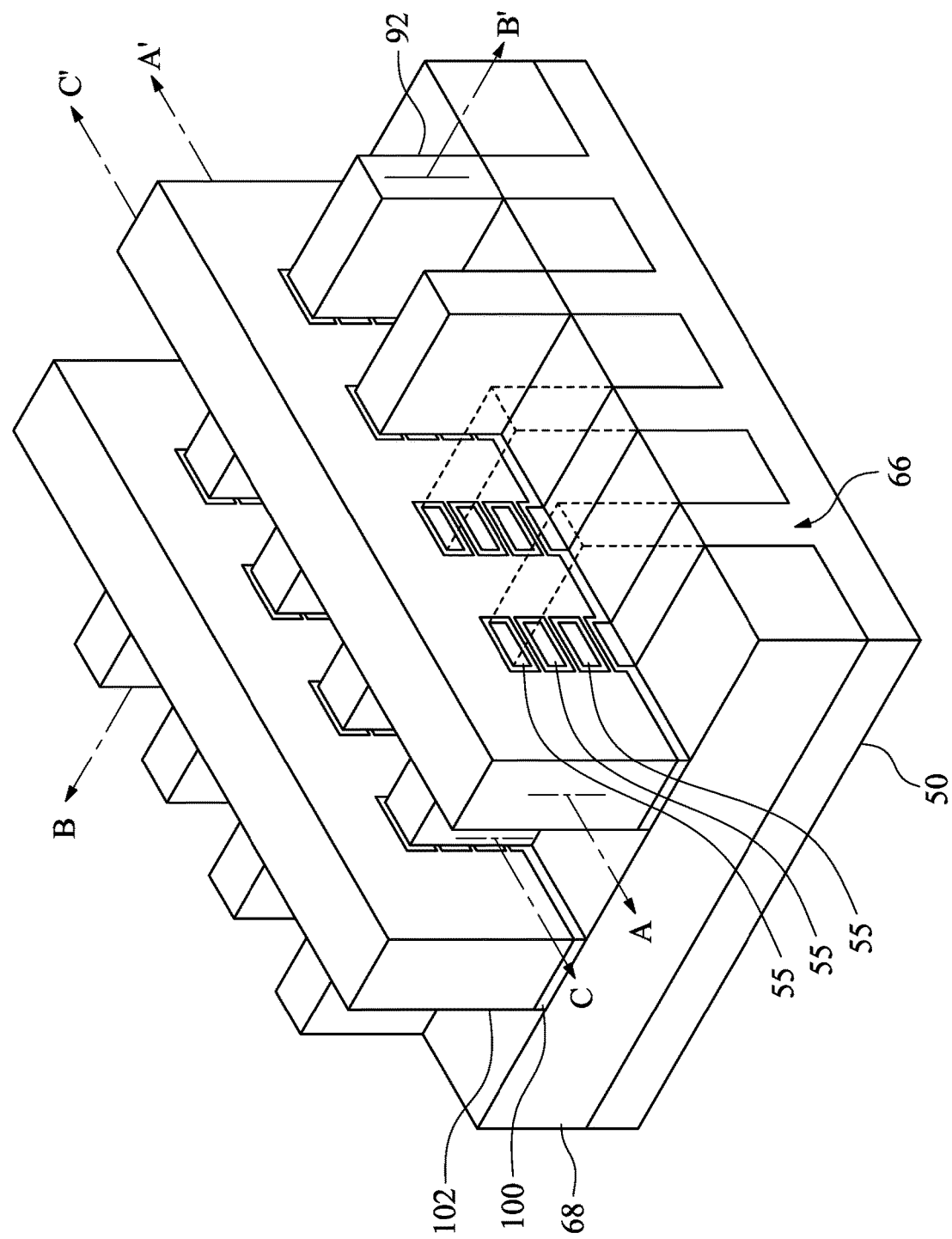
FIG. 1 illustrates an example of a nanostructure field-effect transistor (nano-FET) in a three-dimensional view, in accordance with some embodiments.

FIG. 1 illustrates an example of nano-FETs (e.g., nanowire FETs, nanosheet FETs, or the like) in a three-dimensional view, in accordance with some embodiments. The nano-FETs comprise nanostructures 55 (e.g., nanosheets, nanowire, or the like) over fins 66 on a substrate 50 (e.g., a semiconductor substrate), wherein the nanostructures 55 act as channel regions for the nano-FETs. The nanostructure 55 may include p-type nanostructures, n-type nanostructures, or a combination thereof. Isolation regions 68 are disposed between adjacent fins 66, which may protrude above and from between neighboring isolation regions 68. Although the isolation regions 68 are described/illustrated as being separate from the substrate 50, as used herein, the term "substrate" may refer to the semiconductor substrate alone or a combination of the semiconductor substrate and the isolation regions. Additionally, although a bottom portion of the fins 66 are illustrated as being single, continuous materials with the substrate 50, the bottom portion of the fins 66 and/or the substrate 50 may comprise a single material or a plurality of materials. In this context, the fins 66 refer to the portion extending between the neighboring isolation regions 68. Gate dielectric layers 100 are over top surfaces of the fins 66 and along top surfaces, sidewalls, and bottom surfaces of the nanostructures 55. Gate electrodes 102 are over the gate dielectric layers 100. Epitaxial source/drain regions 92 are disposed on the fins 66 on opposing sides of the gate dielectric layers 100 and the gate electrodes 102.

FIG. 1 further illustrates reference cross-sections that are used in later figures. Cross-section A-A' is along a longitudinal axis of a gate electrode 102 and in a direction, for example, perpendicular to the direction of current flow between the epitaxial source/drain regions 92 of a nano-FET. Cross-section B-B' is perpendicular to cross-section A-A' and is parallel to a longitudinal axis of a fin 66 of the nano-FET and in a direction of, for example, a current flow between the epitaxial source/drain regions 92 of the nano- FET. Cross-section C-C' is parallel to cross-section A-A' and extends through epitaxial source/drain regions of the nano-FETs. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in planar devices, such as planar FETs or in fin field-effect transistors (FinFETs).

FIGS. 2 through 21C are cross-sectional views of intermediate stages in the manufacturing of nano-FETs, in accordance with an embodiment. FIGS. 2 through 5, 6A, 13A, 14A, 15A, 16A, 17A, 18A, 19A, 20A, and 21A illustrate reference cross-section A-A' illustrated in FIG. 1. FIGS. 6B, 7B, 8B, 9B, 10B, 11B, 11C, 12B, 12D, 13B, 14B, 15B, 16B, 17B, 18B, 19B, 20B, and 21B illustrate reference cross-section B-B' illustrated in FIG. 1. FIGS. 7A, 8A, 9A, 10A, 11A, 12A, 12C, 13C, 19C, 20C, and 21C illustrate reference cross-section C-C' illustrated in FIG. 1. FIG. 17C illustrate a zoomed-in view of a portion in FIG. 17A.

Figure 2:
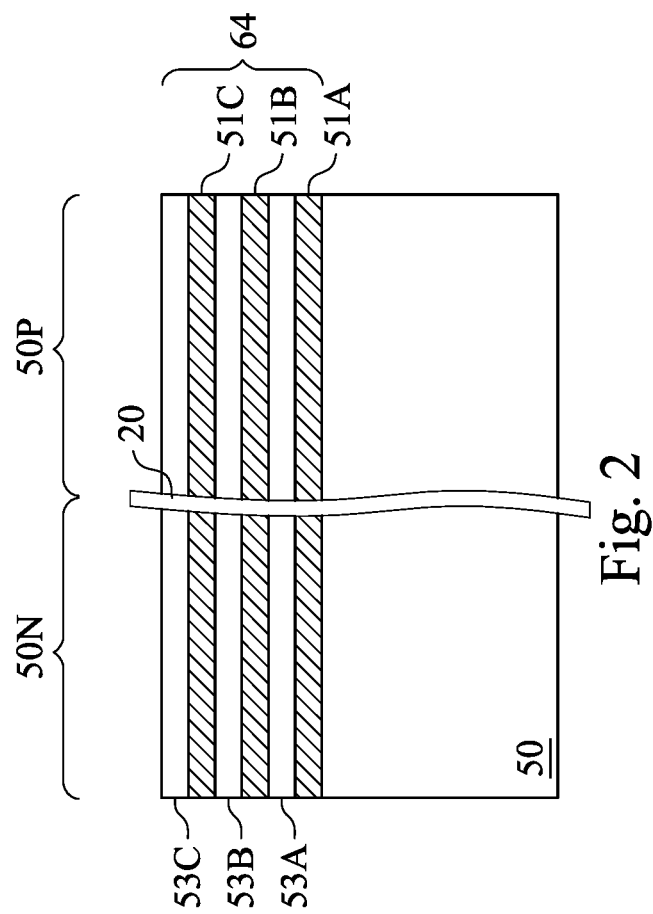

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon substrate or a glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (as illustrated by divider 20), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

Further in FIG. 2, a multi-layer stack 64 is formed over the substrate 50. The multi-layer stack 64 includes alternating layers of first semiconductor layers 51A-51C (collectively referred to as first semiconductor layers 51) and second semiconductor layers 53A-53C (collectively referred to as second semiconductor layers 53). For purposes of illustration and as discussed in greater detail below, the second semiconductor layers 53 will be removed and the first semiconductor layers 51 will be patterned to form channel regions of nano-FETs in the p-type region 50P. Also, the first semiconductor layers 51 will be removed and the second semiconductor layers 53 will be patterned to form channel regions of nano-FETs in the n-type region 50N. Nevertheless, in some embodiments the first semiconductor layers 51 may be removed and the second semiconductor layers 53 may be patterned to form channel regions of nano-FETs in the n-type region 50N, and the second semiconductor layers 53 may be removed and the first semiconductor layers 51 may be patterned to form channel regions of nano-FETs in the p-type region 50P.

Figure 22A:
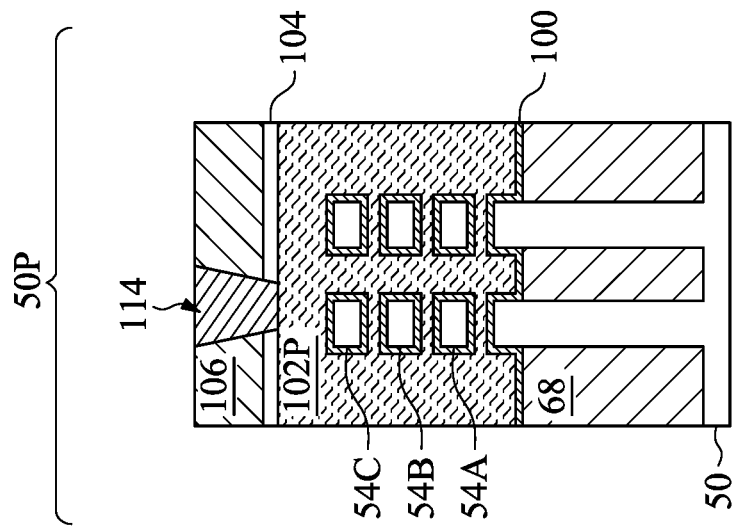
FIGS. 22A, 22B, and 22C are cross-sectional views of a nano-FET, in accordance with an embodiment.
Figure 22A:
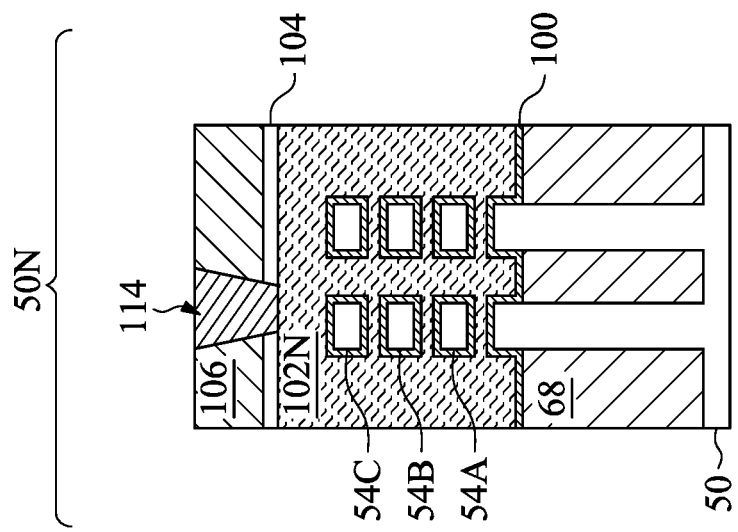
Figure 22B:
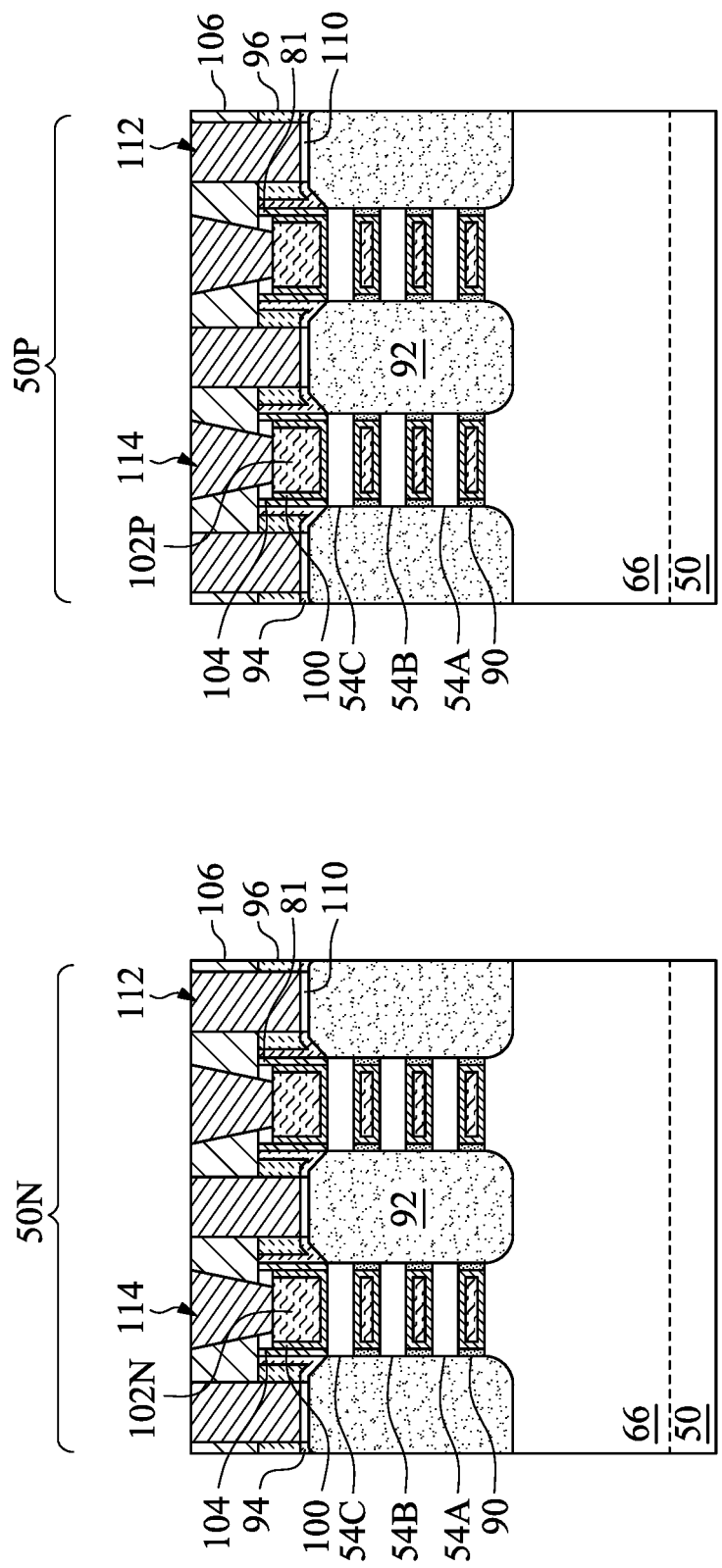
Figure 22C:
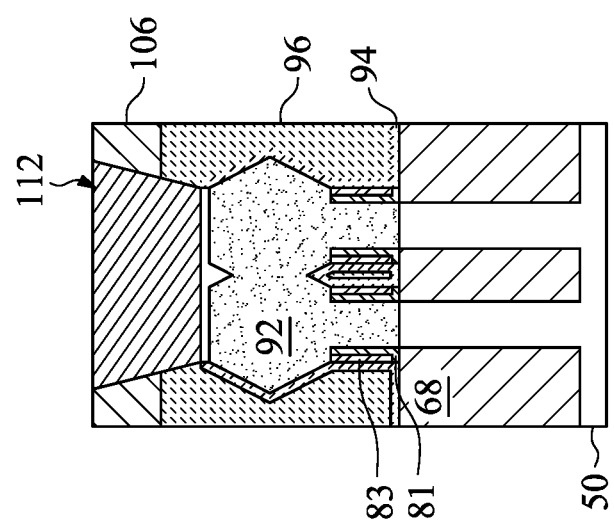

In still other embodiments, the first semiconductor layers 51 may be removed and the second semiconductor layers 53 may be patterned to form channel regions of nano-FETS in both the n-type region 50N and the p-type region 50P. In other embodiments, the second semiconductor layers 53 may be removed and the first semiconductor layers 51 may be patterned to form channel regions of nano-FETs in both the n-type region 50N and the p-type region 50P. In such embodiments, the channel regions in both the n-type region 50N and the p-type region 50P may have a same material composition (e.g., silicon, or the another semiconductor material) and be formed simultaneously. FIGS. 22A, 22B, and 22C illustrate a structure resulting from such embodiments where the channel regions in both the p-type region 50P and the n-type region 50N comprise silicon, for example.

The multi-layer stack 64 is illustrated as having three first semiconductor layers 51 and having three second semiconductor layers 53 for illustrative purposes. In some embodiments, the multi-layer stack 64 may include any number of the first semiconductor layers 51 and the second semiconductor layers 53. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like. In various embodiments, the first semiconductor layers 51 may be formed of a first semiconductor material suitable for p-type nano-FETs, such as silicon germanium, or the like, and the second semiconductor layers 53 may be formed of a second semiconductor material suitable for n-type nano-FETs, such as silicon, silicon carbon, or the like. The multi-layer stack 64 is illustrated as having a bottommost semiconductor layer suitable for p-type nano-FETs for illustrative purposes. In some embodiments, multi-layer stack 64 may be formed such that the bottommost layer is a semiconductor layer suitable for n-type nano-FETs.

The first semiconductor materials and the second semiconductor materials may be materials having a high-etch selectivity to one another. As such, the first semiconductor layers 51 of the first semiconductor material may be removed without significantly removing the second semiconductor layers 53 of the second semiconductor material in the n-type region 50N, thereby allowing the second semiconductor layers 53 to be patterned to form channel regions of n-type nano-FETs. Similarly, the second semiconductor layers 53 of the second semiconductor material may be removed without significantly removing the first semiconductor layers 51 of the first semiconductor material in the p-type region 50P, thereby allowing the first semiconductor layers 51 to be patterned to form channel regions of p-type nano-FETs.

Figure 3:
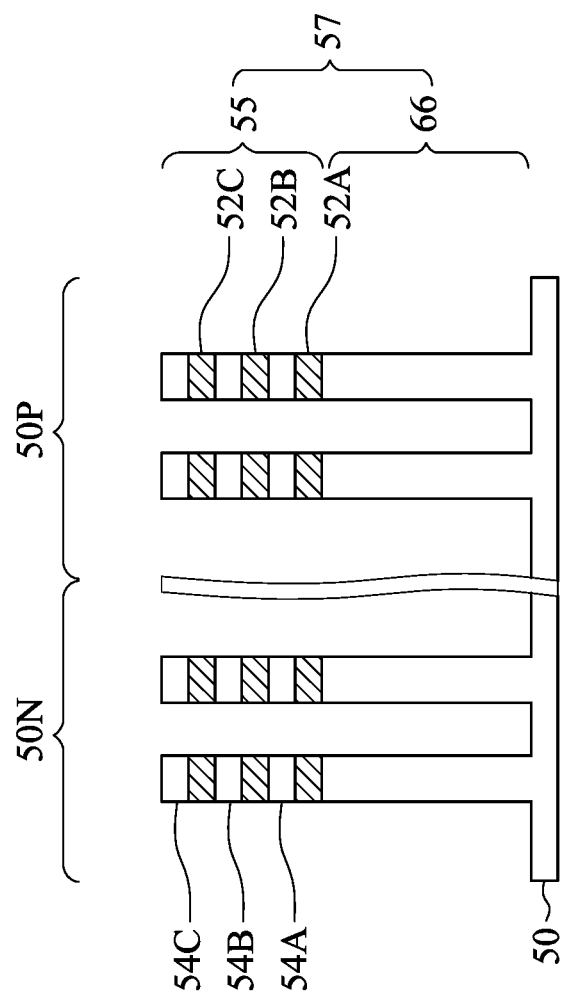

Referring now to FIG. 3, fins 66 are formed in the substrate 50 and nanostructures 55 are formed in the multi-layer stack 64, in accordance with some embodiments. In some embodiments, the nanostructures 55 and the fins 66 may be formed in the multi-layer stack 64 and the substrate 50, respectively, by etching trenches in the multi-layer stack 64 and the substrate 50. The etching may be any acceptable etch process, such as a reactive ion etch (RIE), neutral beam etch (NBE), the like, or a combination thereof. The etching may be anisotropic. Forming the nanostructures 55 by etching the multi-layer stack 64 may further define first nanostructures 52A-52C (collectively referred to as the first nanostructures 52) from the first semiconductor layers 51 and define second nanostructures 54A-54C (collectively referred to as the second nanostructures 54) from the second semiconductor layers 53. The first nanostructures 52 and the second nanostructures 54 may further be collectively referred to as nano structures 55. In the discussion herein, each of the nanostructures 55 may also be referred to as a patterned layer stack 55, and each of the fins 66 and its overlying patterned layer stack 55 may be collectively referred to as a fin structure 57.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 66.

FIG. 3 illustrates the fins 66 in the n-type region 50N and the p-type region 50P as having substantially equal widths for illustrative purposes. In some embodiments, widths of the fins 66 in the n-type region 50N may be greater or thinner than the fins 66 in the p-type region 50P. Further, while each of the fins 66 and the nanostructures 55 are illustrated as having a consistent width throughout, in other embodiments, the fins 66 and/or the nanostructures 55 may have tapered sidewalls such that a width of each of the fins 66 and/or the nanostructures 55 continuously increases in a direction towards the substrate 50. In such embodiments, each of the nanostructures 55 may have a different width and be trapezoidal in shape.

Figure 4:
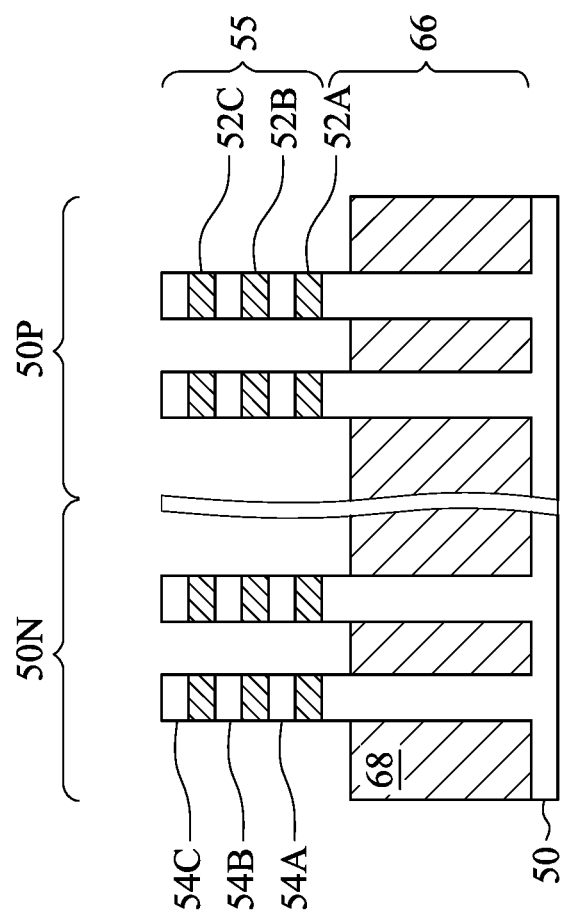

In FIG. 4, shallow trench isolation (STI) regions 68 are formed adjacent the fins 66. The STI regions 68 may be formed by depositing an insulation material over the substrate 50, the fins 66, and nanostructures 55, and between adjacent fins 66. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 55. Although the insulation material is illustrated as a single layer, some embodiments may utilize multiple layers. For example, in some embodiments a liner (not separately illustrated) may first be formed along a surface of the substrate 50, the fins 66, and the nanostructures 55. Thereafter, a fill material, such as those discussed above may be formed over the liner.

A removal process is then applied to the insulation material to remove excess insulation material over the nanostructures 55. In some embodiments, a planarization process such as a chemical mechanical polish (CMP), an etch-back process, combinations thereof, or the like may be utilized. The planarization process exposes the nanostructures 55 such that top surfaces of the nanostructures 55 and the insulation material are level after the planarization process is complete.

The insulation material is then recessed to form the STI regions 68. The insulation material is recessed such that upper portions of fins 66 in the n-type region 50N and the p-type region 50P protrude from between neighboring STI regions 68. Further, the top surfaces of the STI regions 68 may have a flat surface as illustrated, a convex surface, a concave surface (such as dishing), or a combination thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the fins 66 and the nanostructures 55). For example, an oxide removal using, for example, dilute hydrofluoric (dHF) acid may be used.

The process described above with respect to FIGS. 2 through 4 is just one example of how the fins 66 and the nanostructures 55 may be formed. In some embodiments, the fins 66 and/or the nanostructures 55 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 66 and/or the nanostructures 55. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Additionally, the first semiconductor layers 51 (and resulting first nanostructures 52) and the second semiconductor layers 53 (and resulting second nanostructures 54) are illustrated and discussed herein as comprising the same materials in the p-type region 50P and the n-type region 50N for illustrative purposes only. As such, in some embodiments one or both of the first semiconductor layers 51 and the second semiconductor layers 53 may be different materials or formed in a different order in the p-type region 50P and the n-type region 50N.

Further in FIG. 4, appropriate wells (not separately illustrated) may be formed in the fins 66, the nanostructures 55, and/or the STI regions 68. In embodiments with different well types, different implant steps for the n-type region 50N and the p-type region 50P may be achieved using a photoresist or other masks (not separately illustrated). For example, a photoresist may be formed over the fins 66 and the STI regions 68 in the n-type region 50N and the p-type region 50P. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in a range from about $10^{13}$ atoms/cm$^3$ to about $10^{14}$ atoms/cm$^3$. After the implant, the photoresist is removed, such as by an acceptable ashing process.

Following or prior to the implanting of the p-type region 50P, a photoresist or other masks (not separately illustrated) is formed over the fins 66, the nanostructures 55, and the STI regions 68 in the p-type region 50P and the n-type region 50N. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in a range from about $10^{13}$ atoms/cm$^3$ to about $10^{14}$ atoms/cm$^3$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5:
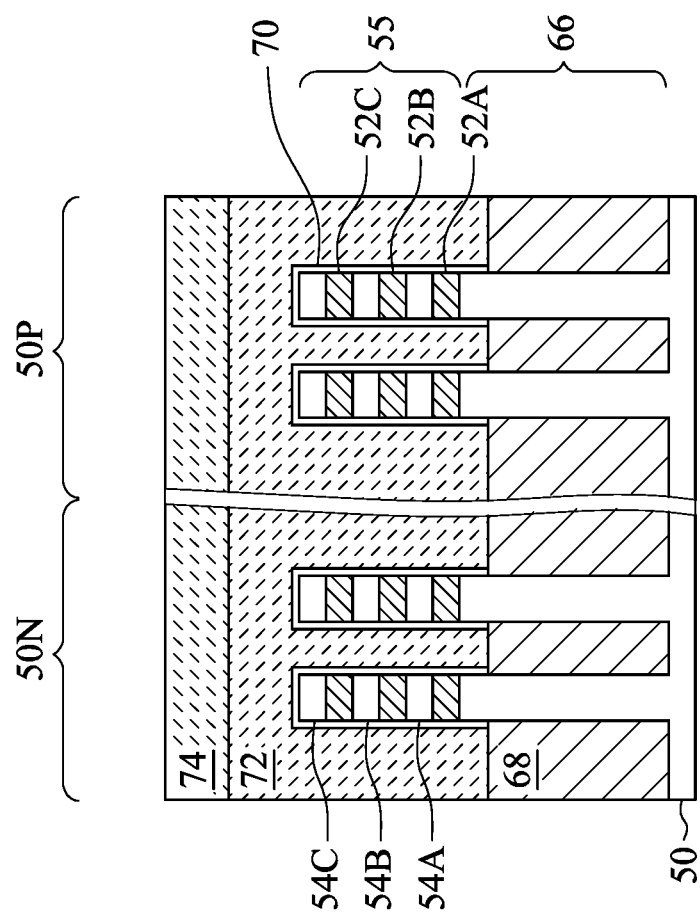

In FIG. 5, a dummy dielectric layer 70 is formed on the fins 66 and/or the nanostructures 55. The dummy dielectric layer 70 may be, for example, silicon oxide, silicon nitride, a combination thereof, or the like, and may be deposited or thermally grown according to acceptable techniques. A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The mask layer 74 may be deposited over the dummy gate layer 72. The dummy gate layer 72 may be formed of a suitable material such as amorphous silicon, polycrystalline-silicon (polysilicon), poly-crystalline silicon-germanium (poly-SiGe), or the like. The dummy gate layer 72 may be deposited by physical vapor deposition (PVD), CVD, sputter deposition, or other techniques for depositing the selected material. The dummy gate layer 72 may be made of other materials that have a high etching selectivity from the etching of isolation regions. The mask layer 74 may include, for example, silicon nitride, silicon oxynitride, or the like. In this example, a single dummy gate layer 72 and a single mask layer 74 are formed across the n-type region 50N and the p-type region 50P. It is noted that the dummy dielectric layer 70 is shown covering only the fins 66 and the nanostructures 55 for illustrative purposes only. In some embodiments, the dummy dielectric layer 70 may be deposited such that the dummy dielectric layer 70 covers the STI regions 68, such that the dummy dielectric layer 70 extends between the dummy gate layer 72 and the STI regions 68.

Figure 6A:
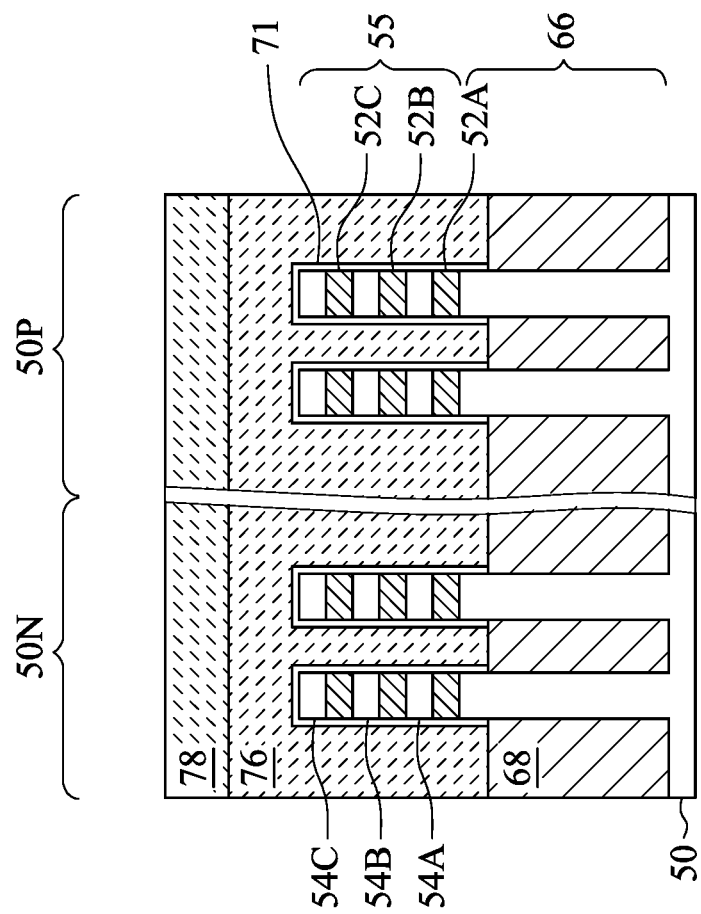
Figure 6B:
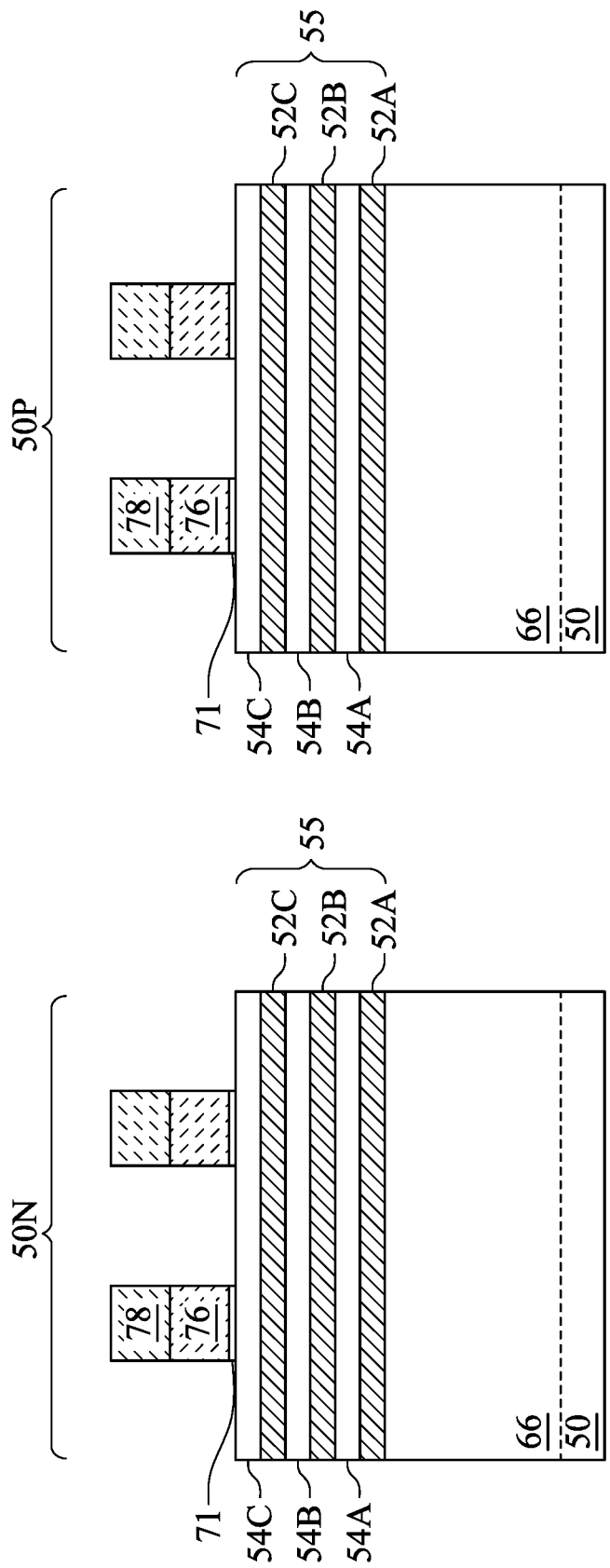

FIGS. 6A through 21C illustrate various additional steps in the manufacturing of embodiment devices. FIGS. 6A, 7A, 8A, 9A, 10A, 11A, 12A, 12C, 13A, 13C, 14A, 15A, 19C, 20C, and 21C illustrate features in either the n-type regions 50N or the p-type regions 50P. In FIGS. 6A and 6B, the mask layer 74 (see FIG. 5) may be patterned using acceptable photolithography and etching techniques to form masks 78. The pattern of the masks 78 then may be transferred to the dummy gate layer 72 and to the dummy dielectric layer 70 to form dummy gates 76 and dummy gate dielectrics 71, respectively. The dummy gates 76 cover respective channel regions of the fins 66. The pattern of the masks 78 may be used to physically separate each of the dummy gates 76 from adjacent dummy gates 76. The dummy gates 76 may also have a lengthwise direction substantially perpendicular to the lengthwise direction of respective fins 66.

Figure 7A:
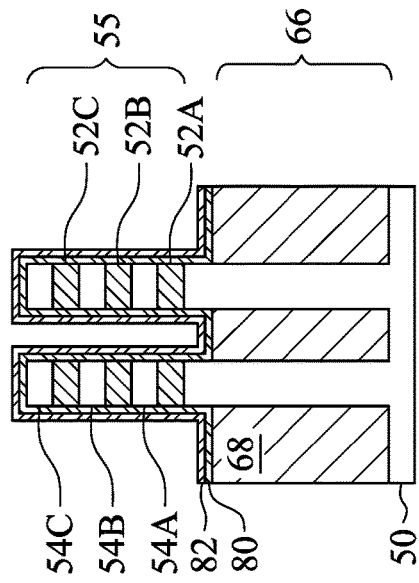
Figure 7B:
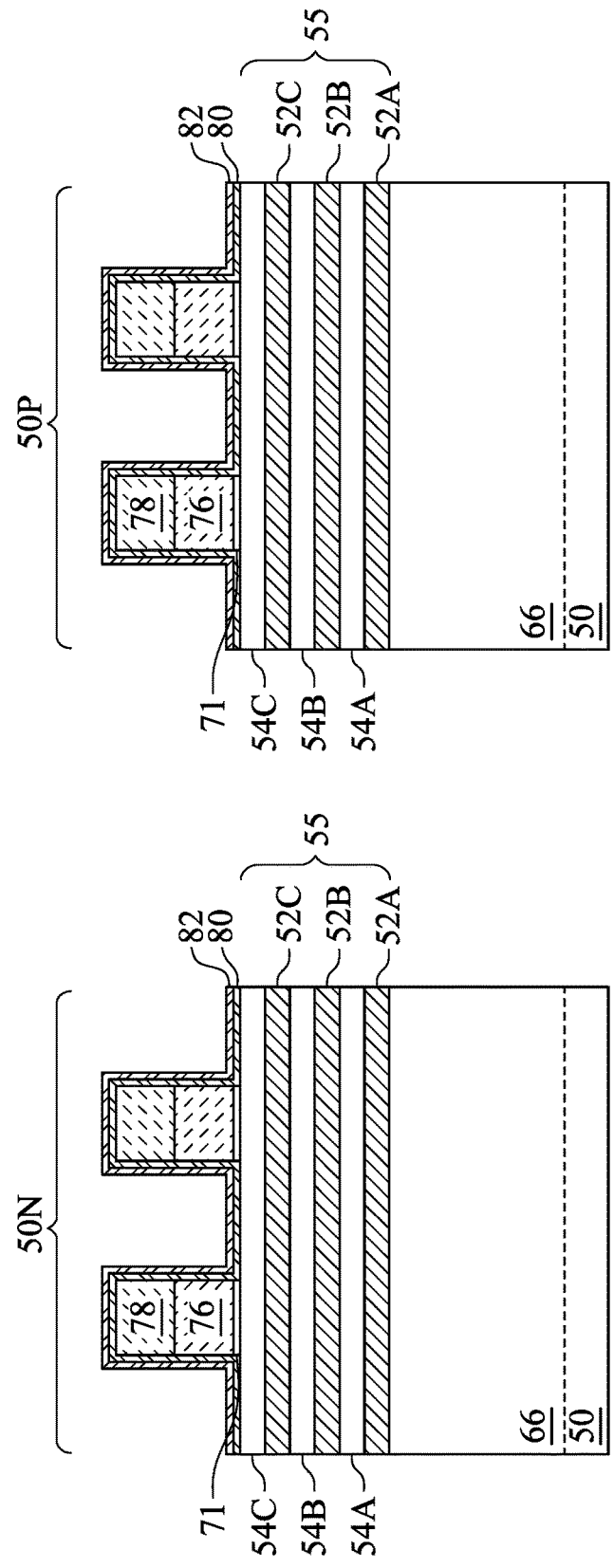

In FIGS. 7A and 7B, a first spacer layer 80 and a second spacer layer 82 are formed over the structures illustrated in FIGS. 6A and 6B. The first spacer layer 80 and the second spacer layer 82 will be subsequently patterned to act as spacers for forming self-aligned source/drain regions. In FIGS. 7A and 7B, the first spacer layer 80 is formed on top surfaces of the STI regions 68; top surfaces and sidewalls of the fins 66, the nanostructures 55, and the masks 78; and sidewalls of the dummy gates 76 and the dummy gate dielectric 71. The second spacer layer 82 is deposited over the first spacer layer 80. The first spacer layer 80 may be formed of silicon oxide, silicon nitride, silicon oxynitride, or the like, using techniques such as thermal oxidation or deposited by CVD, ALD, or the like. The second spacer layer 82 may be formed of a material having a different etch rate than the material of the first spacer layer 80, such as silicon oxide, silicon nitride, silicon oxynitride, or the like, and may be deposited by CVD, ALD, or the like.

After the first spacer layer 80 is formed and prior to forming the second spacer layer 82, implants for lightly doped source/drain (LDD) regions (not separately illustrated) may be performed. In embodiments with different device types, similar to the implants discussed above in FIG. 4, a mask, such as a photoresist, may be formed over the n-type region 50N, while exposing the p-type region 50P, and appropriate type (e.g., p-type) impurities may be implanted into the exposed fins 66 and nanostructures 55 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 66 and nanostructures 55 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities in a range from about $1 \times 10^{15}$ atoms/cm$^3$ to about $1 \times 10^{19}$ atoms/cm$^3$. An anneal may be used to repair implant damage and to activate the implanted impurities.

Figure 8A:
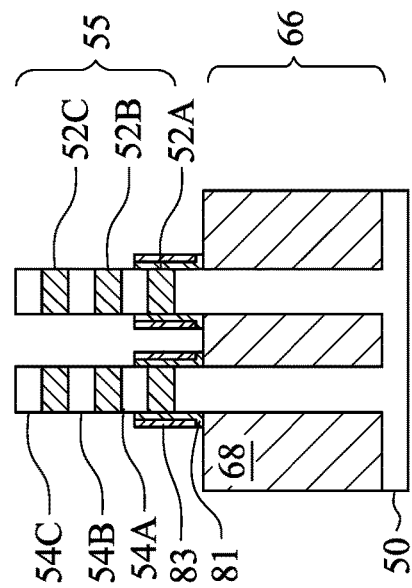
Figure 8B:
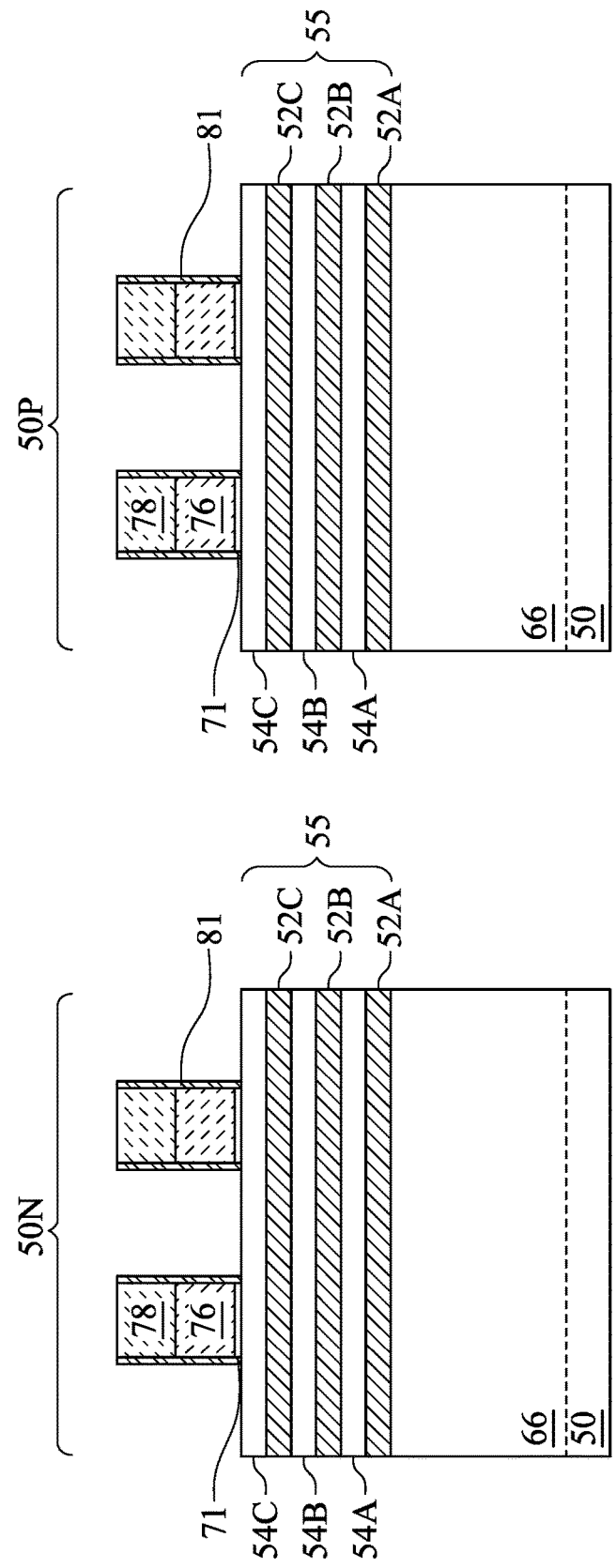

In FIGS. 8A and 8B, the first spacer layer 80 and the second spacer layer 82 are etched to form first spacers 81 and second spacers 83. As will be discussed in greater detail below, the first spacers 81 and the second spacers 83 act to self-align subsequently formed source drain regions, as well as to protect sidewalls of the fins 66 and/or nanostructure 55 during subsequent processing. The first spacer layer 80 and the second spacer layer 82 may be etched using a suitable etching process, such as an isotropic etching process (e.g., a wet etching process), an anisotropic etching process (e.g., a dry etching process), or the like. In some embodiments, the material of the second spacer layer 82 has a different etch rate than the material of the first spacer layer 80, such that the first spacer layer 80 may act as an etch stop layer when patterning the second spacer layer 82 and such that the second spacer layer 82 may act as a mask when patterning the first spacer layer 80. For example, the second spacer layer 82 may be etched using an anisotropic etch process wherein the first spacer layer 80 acts as an etch stop layer, wherein remaining portions of the second spacer layer 82 form second spacers 83 as illustrated in FIG. 8A. Thereafter, the second spacers 83 acts as a mask while etching exposed portions of the first spacer layer 80, thereby forming first spacers 81 as illustrated in FIG. 8A.

As illustrated in FIG. 8A, the first spacers 81 and the second spacers 83 are disposed on sidewalls of the fins 66 and/or nanostructures 55. As illustrated in FIG. 8B, in some embodiments, the second spacer layer 82 may be removed from over the first spacer layer 80 adjacent the masks 78, the dummy gates 76, and the dummy gate dielectrics 71, and the first spacers 81 are disposed on sidewalls of the masks 78, the dummy gates 76, and the dummy dielectric layers 60. In other embodiments, a portion of the second spacer layer 82 may remain over the first spacer layer 80 adjacent the masks 78, the dummy gates 76, and the dummy gate dielectrics 71.

It is noted that the above disclosure generally describes a process of forming spacers and LDD regions. Other processes and sequences may be used. For example, fewer or additional spacers may be utilized, different sequence of steps may be utilized (e.g., the first spacers 81 may be patterned prior to depositing the second spacer layer 82), additional spacers may be formed and removed, and/or the like. Furthermore, the n-type and p-type devices may be formed using different structures and steps.

Figure 9A:
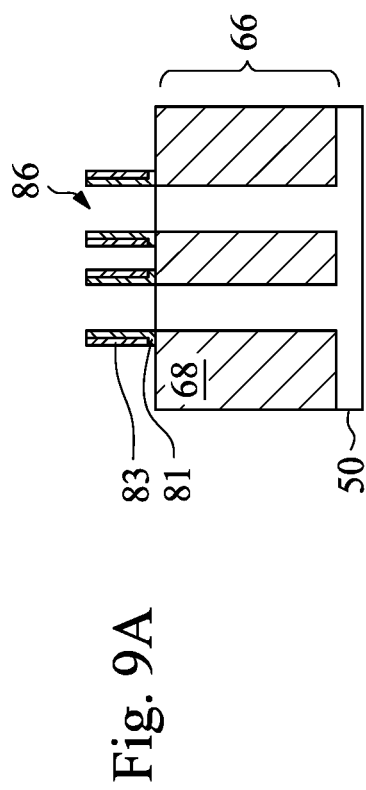
Figure 9B:
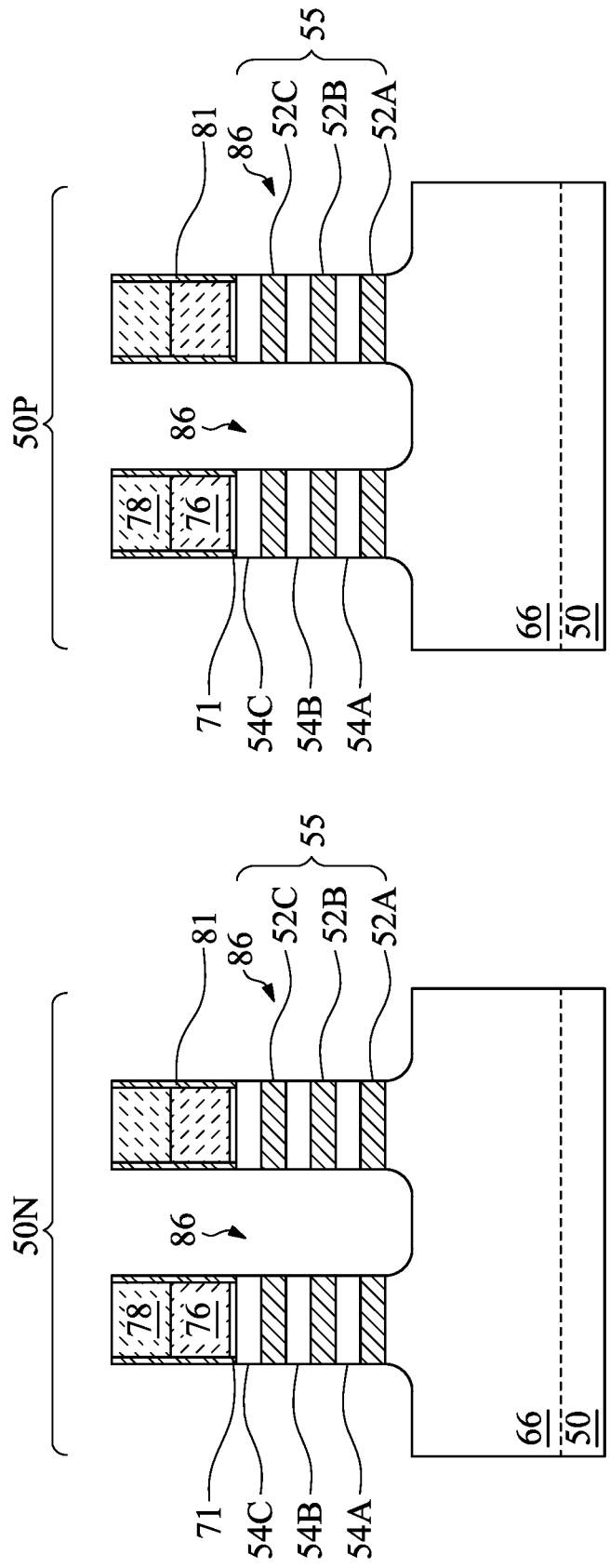

In FIGS. 9A and 9B, first recesses 86 are formed in the fins 66, the nanostructures 55, and the substrate 50, in accordance with some embodiments. Epitaxial source/drain regions will be subsequently formed in the first recesses 86. The first recesses 86 may extend through the first nanostructures 52 and the second nanostructures 54, and into the substrate 50. As illustrated in FIG. 9A, top surfaces of the STI regions 58 may be level with bottom surfaces of the first recesses 86. In various embodiments, the fins 66 may be etched such that bottom surfaces of the first recesses 86 are disposed below the top surfaces of the STI regions 68; or the like. The first recesses 86 may be formed by etching the fins 66, the nanostructures 55, and the substrate 50 using anisotropic etching processes, such as RIE, NBE, or the like. The first spacers 81, the second spacers 83, and the masks 78 mask portions of the fins 66, the nanostructures 55, and the substrate 50 during the etching processes used to form the first recesses 86. A single etch process or multiple etch processes may be used to etch each layer of the nanostructures 55 and/or the fins 66. Timed etch processes may be used to stop the etching of the first recesses 86 after the first recesses 86 reach a desired depth.

In FIGS. 10A and 10B, portions of sidewalls of the layers of the multi-layer stack 64 formed of the first semiconductor materials (e.g., the first nanostructures 52) exposed by the first recesses 86 are etched to form sidewall recesses 88 in the n-type region 50N, and portions of sidewalls of the layers of the multi-layer stack 56 formed of the second semiconductor materials (e.g., the second nanostructures 54) exposed by the first recesses 86 are etched to form sidewall recesses 88 in the p-type region 50P. Although sidewalls of the first nanostructures 52 and the second nanostructures 54 in sidewall recesses 88 are illustrated as being straight in FIG. 10B, the sidewalls may be concave or convex. The sidewalls may be etched using isotropic etching processes, such as wet etching or the like. The p-type region 50P may be protected using a mask (not shown) while etchants selective to the first semiconductor materials are used to etch the first nanostructures 52 such that the second nanostructures 54 and the substrate 50 remain relatively unetched as compared to the first nanostructures 52 in the n-type region 50N. Similarly, the n-type region 50N may be protected using a mask (not shown) while etchants selective to the second semiconductor materials are used to etch the second nanostructures 54 such that the first nanostructures 52 and the substrate 50 remain relatively unetched as compared to the second nanostructures 54 in the p-type region 50P. In an embodiment in which the first nanostructures 52 include, e.g., SiGe, and the second nanostructures 54 include, e.g., Si or SiC, a dry etch process with tetramethylammonium hydroxide (TMAH), ammonium hydroxide (NH$_4$OH), or the like may be used to etch sidewalls of the first nanostructures 52 in the n-type region 50N, and a wet or dry etch process with hydrogen fluoride, another fluorine-based etchant, or the like may be used to etch sidewalls of the second nanostructures 54 in the p-type region 50P.

Figure 11C:
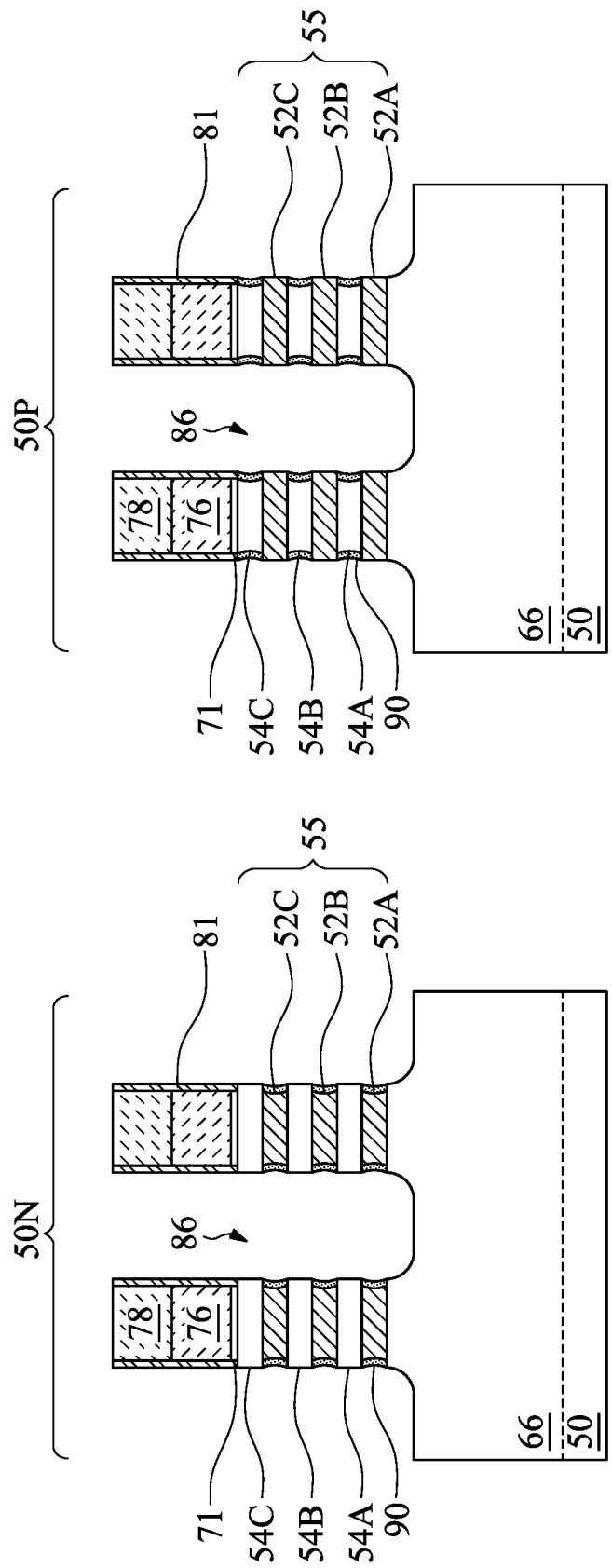

In FIGS. 11A-11C, first inner spacers 90 are formed in the sidewall recess 88. The first inner spacers 90 may be formed by depositing an inner spacer layer (not separately illustrated) over the structures illustrated in FIGS. 10A and 10B. The first inner spacers 90 act as isolation features between subsequently formed source/drain regions and a gate structure. As will be discussed in greater detail below, source/drain regions will be formed in the first recesses 86, while the first nanostructures 52 in the n-type region 50N and the second nanostructures 54 in the p-type region 50P will be replaced with corresponding gate structures.

The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be anisotropically etched to form the first inner spacers 90. Although outer sidewalls of the first inner spacers 90 are illustrated as being flush with sidewalls of the second nanostructures 54 in the n-type region 50N and flush with the sidewalls of the first nanostructures 52 in the p-type region 50P, the outer sidewalls of the first inner spacers 90 may extend beyond or be recessed from sidewalls of the second nanostructures 54 and/or the first nanostructures 52, respectively.

Moreover, although the outer sidewalls of the first inner spacers 90 are illustrated as being straight in FIG. 11B, the outer sidewalls of the first inner spacers 90 may be concave or convex. As an example, FIG. 11C illustrates an embodiment in which sidewalls of the first nanostructures 52 are concave, outer sidewalls of the first inner spacers 90 are concave, and the first inner spacers 90 are recessed from sidewalls of the second nanostructures 54 in the n-type region 50N. Also illustrated are embodiments in which sidewalls of the second nanostructures 54 are concave, outer sidewalls of the first inner spacers 90 are concave, and the first inner spacers 90 are recessed from sidewalls of the first nanostructures 52 in the p-type region 50P. The inner spacer layer may be etched by an anisotropic etching process, such as RIE, NBE, or the like. The first inner spacers 90 may be used to prevent damage to subsequently formed source/drain regions (such as the epitaxial source/drain regions 92, discussed below with respect to FIGS. 12A-12C) by subsequent etching processes, such as etching processes used to form gate structures.

Figure 12A:
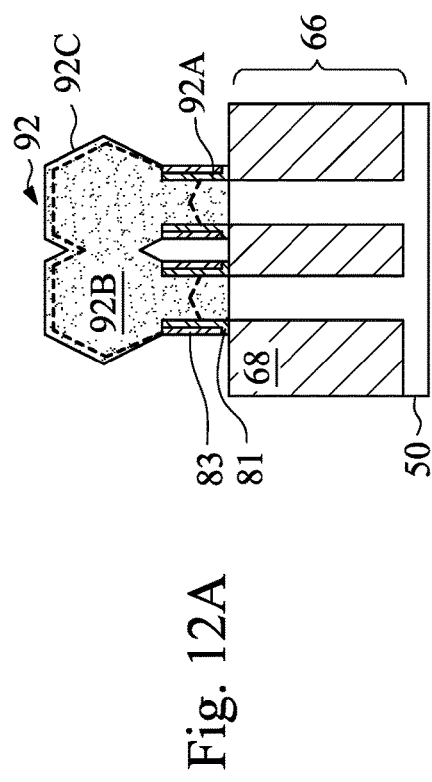
Figure 12B:
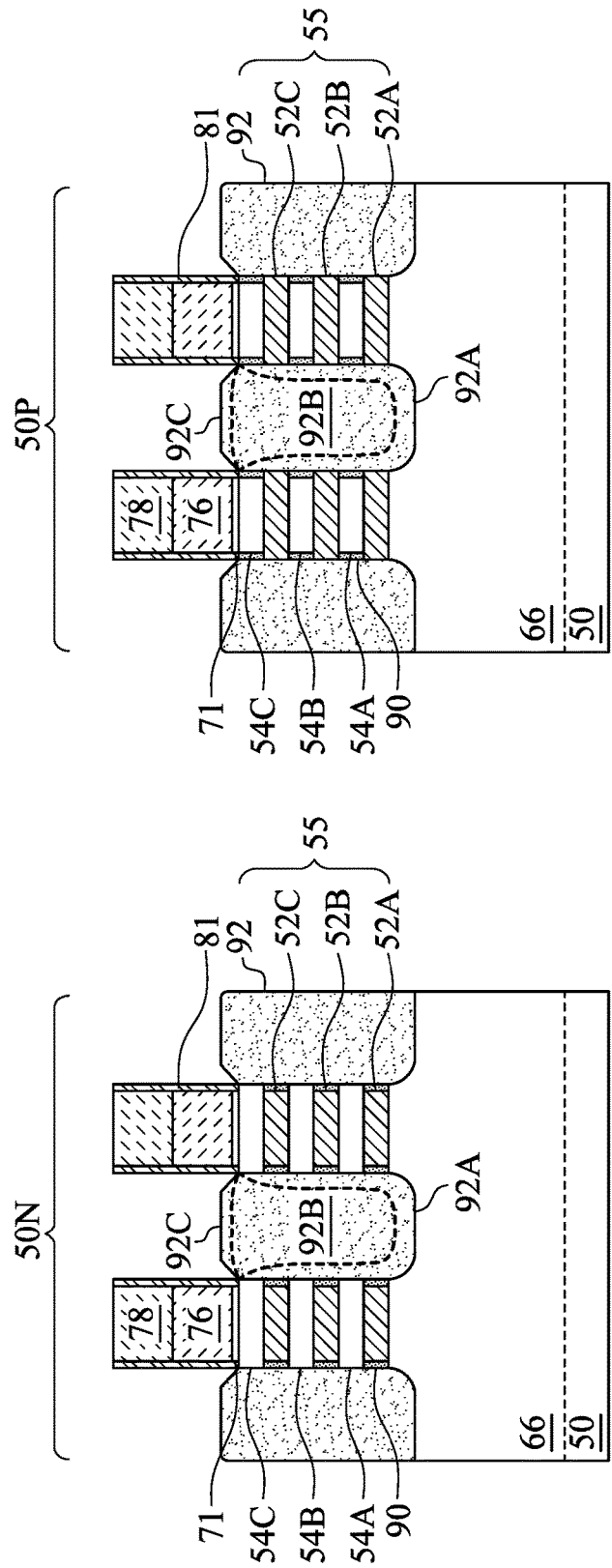
Figures 12C, 12D:
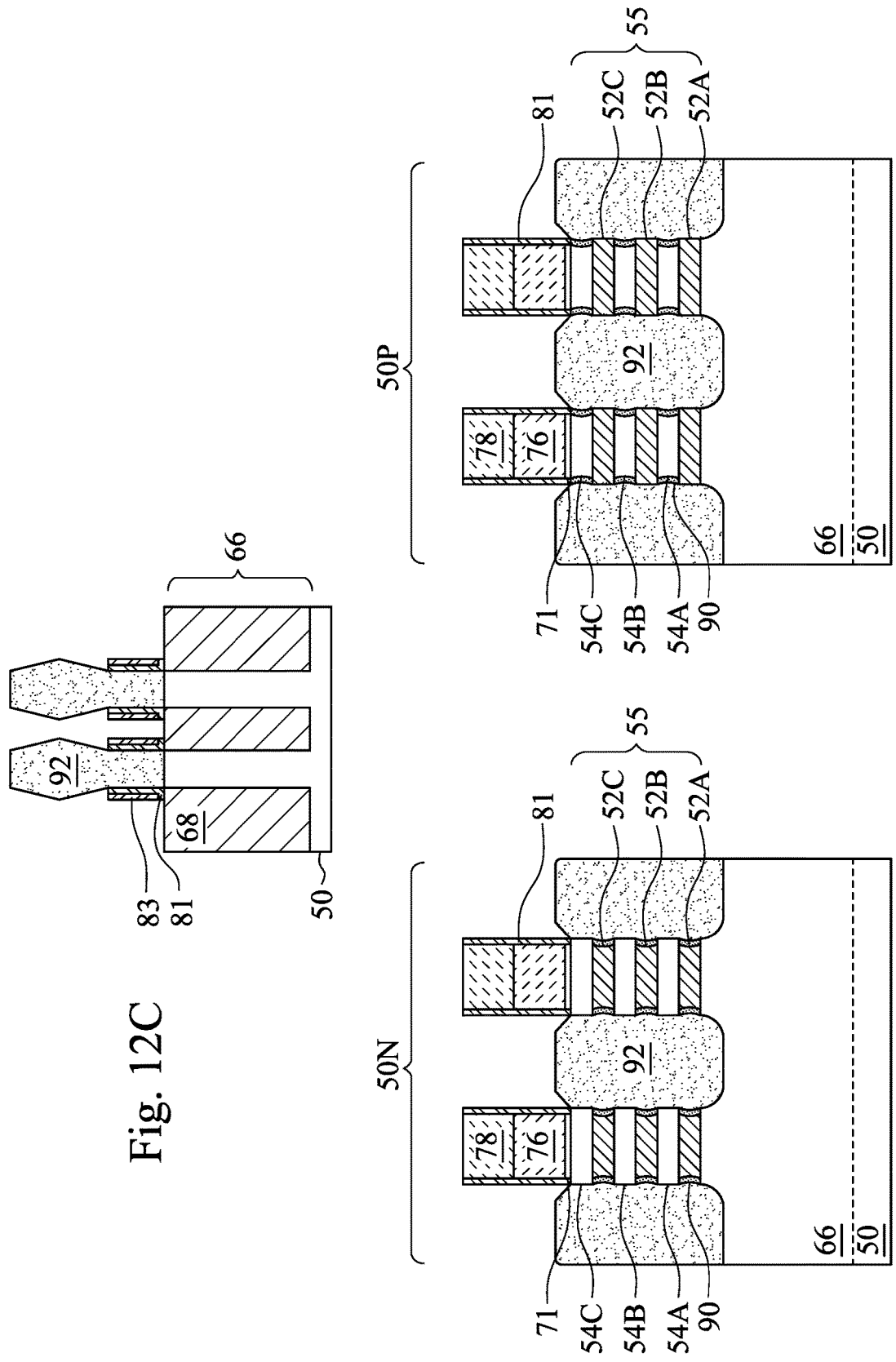

In FIGS. 12A-12C, epitaxial source/drain regions 92 are formed in the first recesses 86. In some embodiments, the source/drain regions 92 may exert stress on the second nanostructures 54 in the n-type region 50N and on the first nanostructures 52 in the p-type region 50P, thereby improving performance. As illustrated in FIG. 12B, the epitaxial source/drain regions 92 are formed in the first recesses 86 such that each dummy gate 76 is disposed between respective neighboring pairs of the epitaxial source/drain regions 92. In some embodiments, the first spacers 81 are used to separate the epitaxial source/drain regions 92 from the dummy gates 76 and the first inner spacers 90 are used to separate the epitaxial source/drain regions 92 from the nanostructures 55 by an appropriate lateral distance so that the epitaxial source/drain regions 92 do not short out with subsequently formed gates of the resulting nano-FETs.

The epitaxial source/drain regions 92 in the n-type region 50N, e.g., the NMOS region, may be formed by masking the p-type region 50P, e.g., the PMOS region. Then, the epitaxial source/drain regions 92 are epitaxially grown in the first recesses 86 in the n-type region 50N. The epitaxial source/drain regions 92 may include any acceptable material appropriate for n-type nano-FETs. For example, if the second nanostructures 54 are silicon, the epitaxial source/drain regions 92 may include materials exerting a tensile strain on the second nanostructures 54, such as silicon, silicon carbide, phosphorous doped silicon carbide, silicon phosphide, or the like. The epitaxial source/drain regions 92 may have surfaces raised from respective upper surfaces of the nanostructures 55 and may have facets.

The epitaxial source/drain regions 92 in the p-type region 50P, e.g., the PMOS region, may be formed by masking the n-type region 50N, e.g., the NMOS region. Then, the epitaxial source/drain regions 92 are epitaxially grown in the first recesses 86 in the p-type region 50P. The epitaxial source/drain regions 92 may include any acceptable material appropriate for p-type nano-FETs. For example, if the first nanostructures 52 are silicon germanium, the epitaxial source/drain regions 92 may comprise materials exerting a compressive strain on the first nanostructures 52, such as silicon-germanium, boron doped silicon-germanium, germanium, germanium tin, or the like. The epitaxial source/drain regions 92 may also have surfaces raised from respective surfaces of the multi-layer stack 56 and may have facets.

The epitaxial source/drain regions 92, the first nanostructures 52, the second nanostructures 54, and/or the substrate 50 may be implanted with dopants to form source/drain regions, similar to the process previously discussed for forming lightly-doped source/drain regions, followed by an anneal. The source/drain regions may have an impurity concentration of between about $1 \times 10^{19}$ atoms/cm$^3$ and about $1 \times 10^{21}$ atoms/cm$^3$. The n-type and/or p-type impurities for source/drain regions may be any of the impurities previously discussed. In some embodiments, the epitaxial source/drain regions 92 may be in situ doped during growth.

As a result of the epitaxy processes used to form the epitaxial source/drain regions 92 in the n-type region 50N and the p-type region 50P, upper surfaces of the epitaxial source/drain regions 92 have facets which expand laterally outward beyond sidewalls of the nanostructures 55. In some embodiments, these facets cause adjacent epitaxial source/drain regions 92 of a same nano-FET to merge as illustrated by FIG. 12A. In other embodiments, adjacent epitaxial source/drain regions 92 remain separated after the epitaxy process is completed as illustrated by FIG. 12C. In the embodiments illustrated in FIGS. 12A and 12C, the first spacers 81 may be formed to a top surface of the STI regions 68 thereby blocking the epitaxial growth. In some other embodiments, the first spacers 81 may cover portions of the sidewalls of the nanostructures 55 further blocking the epitaxial growth. In some other embodiments, the spacer etch used to form the first spacers 81 may be adjusted to remove the spacer material to allow the epitaxially grown region to extend to the surface of the STI region 58.

The epitaxial source/drain regions 92 may comprise one or more semiconductor material layers. For example, the epitaxial source/drain regions 92 may comprise a first semiconductor material layer 92A, a second semiconductor material layer 92B, and a third semiconductor material layer 92C. Any number of semiconductor material layers may be used for the epitaxial source/drain regions 92. Each of the first semiconductor material layer 92A, the second semiconductor material layer 92B, and the third semiconductor material layer 92C may be formed of different semiconductor materials and may be doped to different dopant concentrations. In some embodiments, the first semiconductor material layer 92A may have a dopant concentration less than the second semiconductor material layer 92B and greater than the third semiconductor material layer 92C. In embodiments in which the epitaxial source/drain regions 92 comprise three semiconductor material layers, the first semiconductor material layer 92A may be deposited, the second semiconductor material layer 92B may be deposited over the first semiconductor material layer 92A, and the third semiconductor material layer 92C may be deposited over the second semiconductor material layer 92B.

FIG. 12D illustrates an embodiment in which sidewalls of the first nanostructures 52 in the n-type region 50N and sidewalls of the second nanostructures 54 in the p-type region 50P are concave, outer sidewalls of the first inner spacers 90 are concave, and the first inner spacers 90 are recessed from sidewalls of the second nanostructures 54 and the first nanostructures 52, respectively. As illustrated in FIG. 12D, the epitaxial source/drain regions 92 may be formed in contact with the first inner spacers 90 and may extend past sidewalls of the second nanostructures 54 in the n-type region 50N and past sidewalls of the first nanostructures 52 in the p-type region 50P.

Figure 13B:
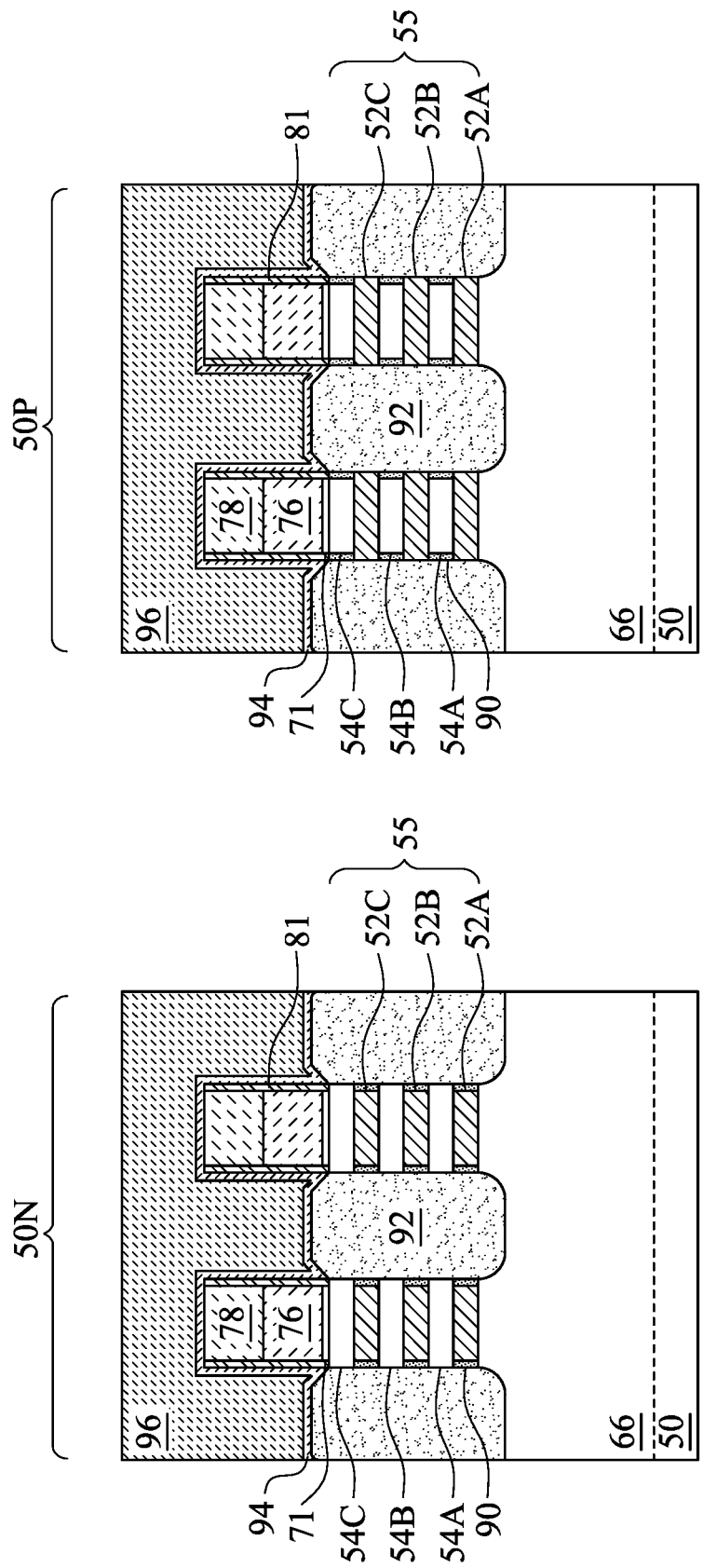
Figure 13C:
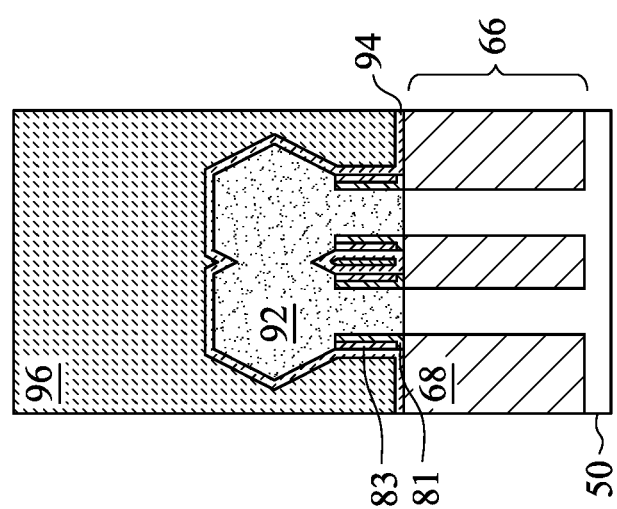

In FIGS. 13A-13C, a first interlayer dielectric (ILD) 96 is deposited over the structure illustrated in FIGS. 6A, 12B, and 12A (the processes of FIGS. 7A-12D do not alter the cross-section illustrated in FIGS. 6A), respectively. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 94 is disposed between the first ILD 96 and the epitaxial source/drain regions 92, the masks 78, and the first spacers 81. The CESL 94 may comprise a dielectric material, such as, silicon nitride, silicon oxide, silicon oxynitride, or the like, having a different etch rate than the material of the overlying first ILD 96.

Figure 14A:
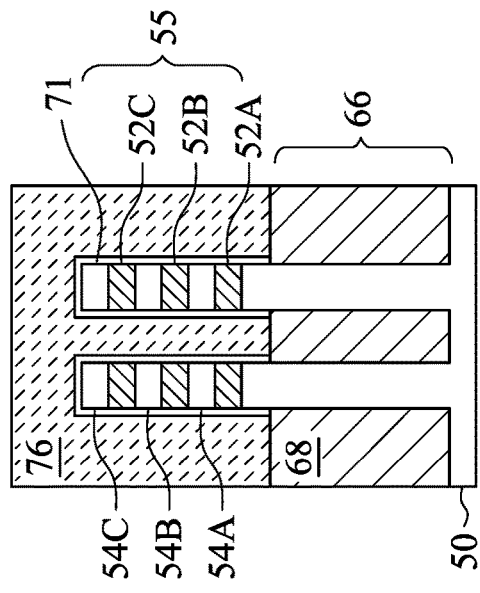
Figure 14B:
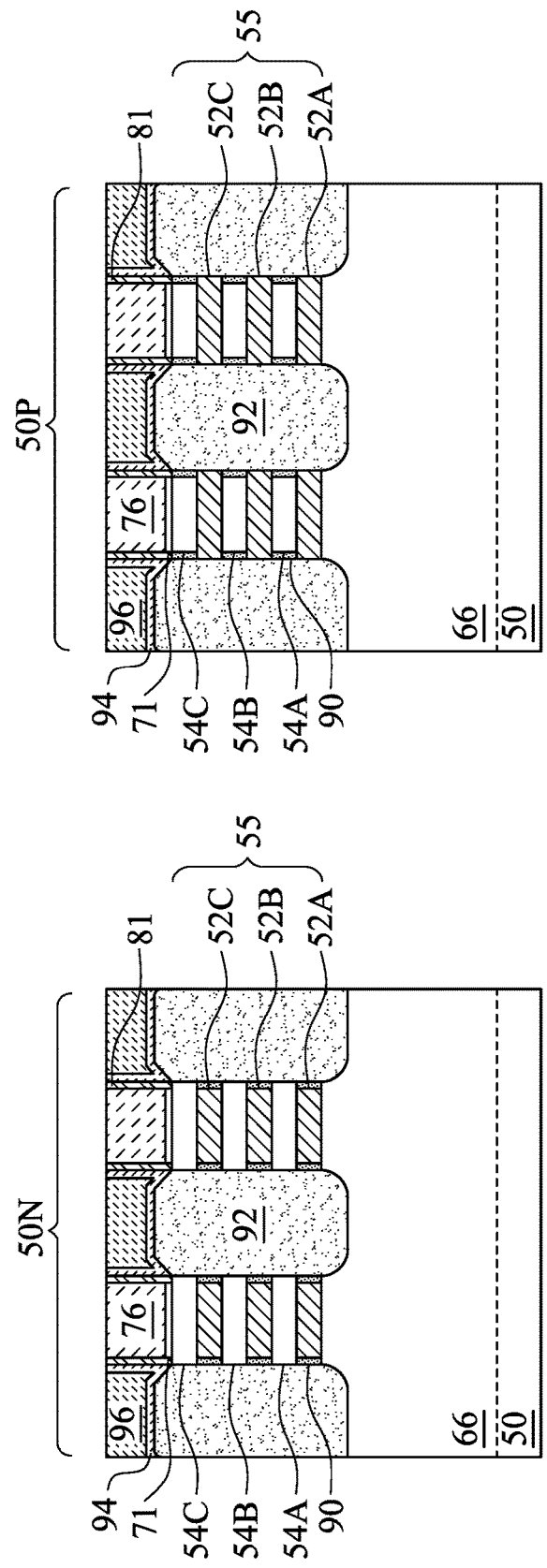

In FIGS. 14A and 14B, a planarization process, such as a CMP, may be performed to level the top surface of the first ILD 96 with the top surfaces of the dummy gates 76 or the masks 78. The planarization process may also remove the masks 78 on the dummy gates 76, and portions of the first spacers 81 along sidewalls of the masks 78. After the planarization process, top surfaces of the dummy gates 76, the first spacers 81, and the first ILD 96 are level within process variations. Accordingly, the top surfaces of the dummy gates 76 are exposed through the first ILD 96. In some embodiments, the masks 78 may remain, in which case the planarization process levels the top surface of the first ILD 96 with top surface of the masks 78 and the first spacers 81.

Figure 15A:
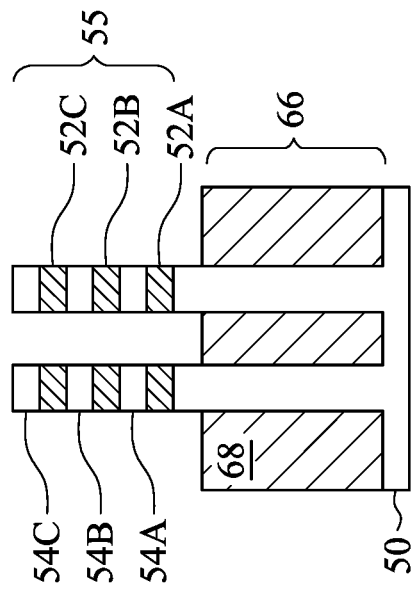
Figure 15B:
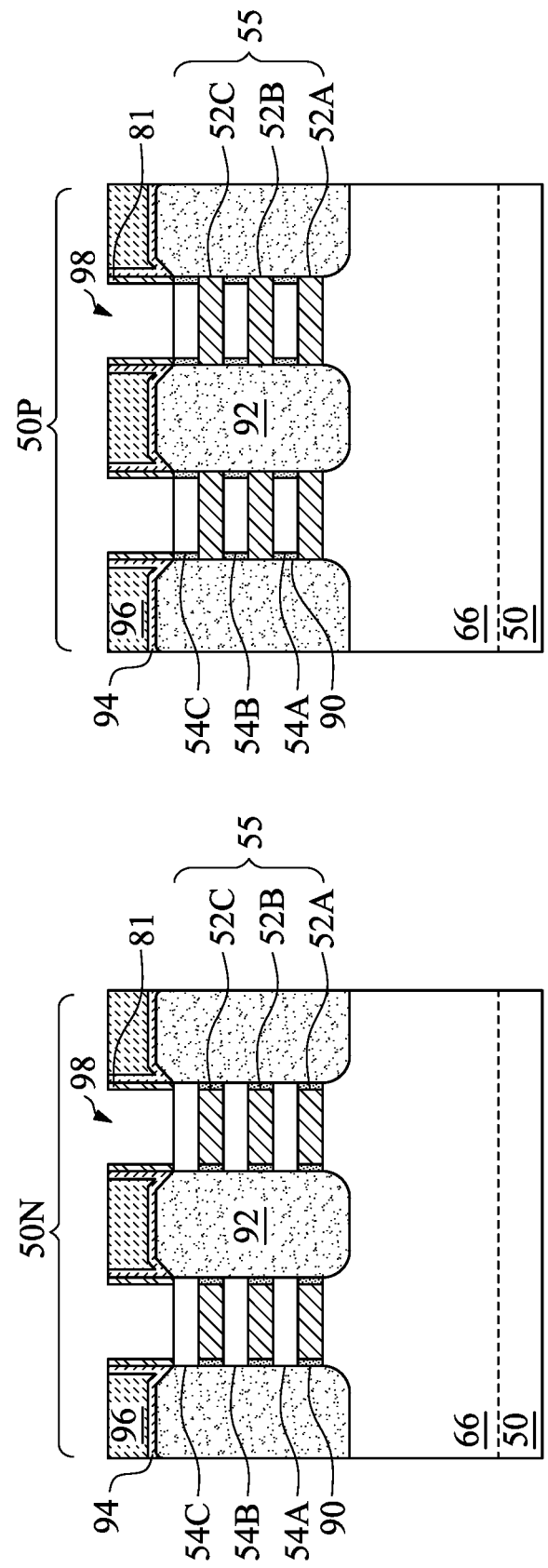

In FIGS. 15A and 15B, the dummy gates 76, and the masks 78 if present, are removed in one or more etching steps, so that second recesses 98 are formed. Portions of the dummy dielectric layers 60 in the second recesses 98 are also be removed. In some embodiments, the dummy gates 76 and the dummy dielectric layers 60 are removed by an anisotropic dry etch process. For example, the etching process may include a dry etch process using reaction gas(es) that selectively etch the dummy gates 76 at a faster rate than the first ILD 96 or the first spacers 81. Each second recess 98 exposes and/or overlies portions of nanostructures 55, which act as channel regions in subsequently completed nano-FETs. Portions of the nanostructures 55 which act as the channel regions are disposed between neighboring pairs of the epitaxial source/drain regions 92. During the removal, the dummy dielectric layers 60 may be used as etch stop layers when the dummy gates 76 are etched. The dummy dielectric layers 60 may then be removed after the removal of the dummy gates 76.

Figure 16A:
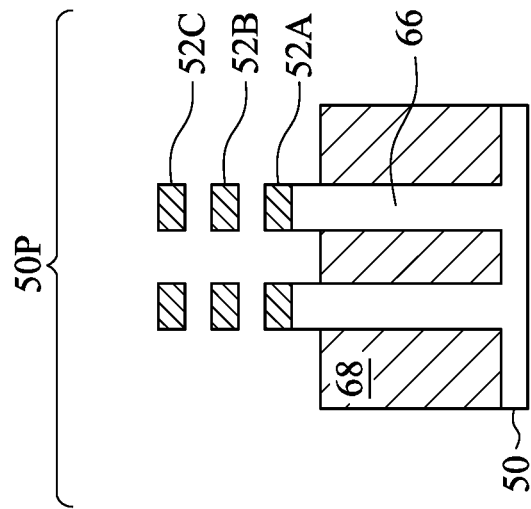
Figure 16A:
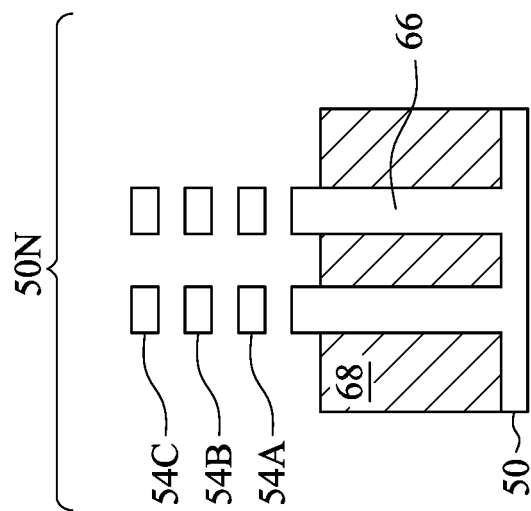
Figure 16B:
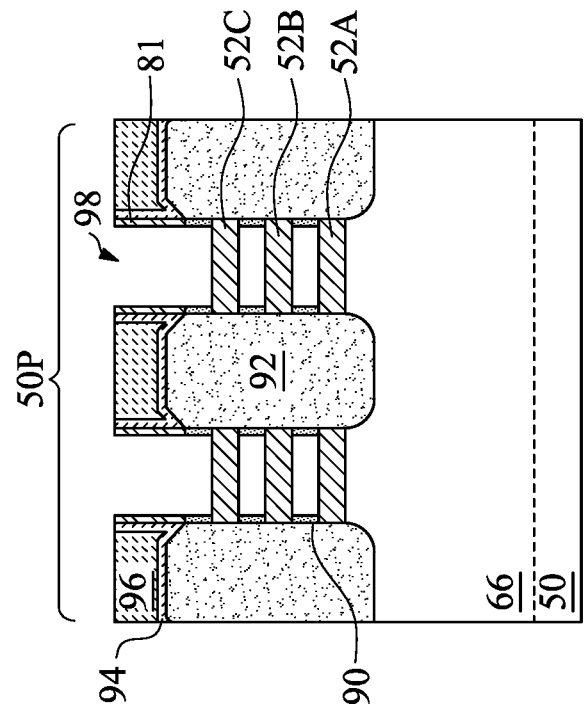
Figure 16B:
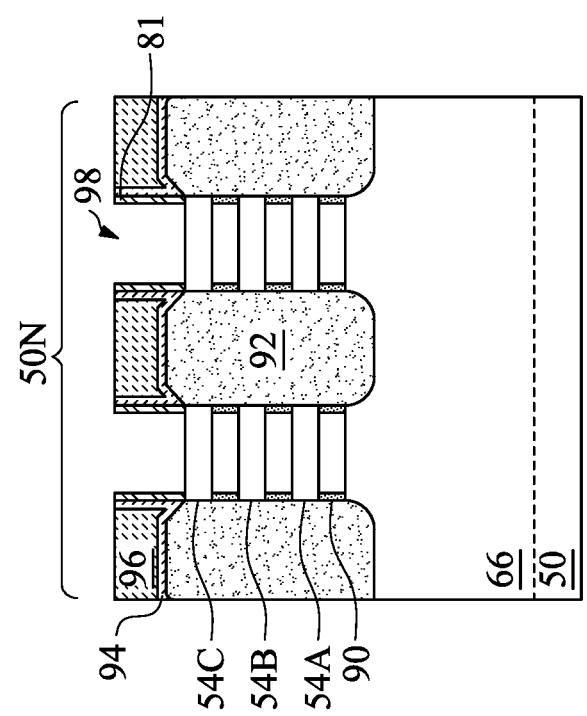

In FIGS. 16A and 16B, the first nanostructures 52 in the n-type region 50N and the second nanostructures 54 in the p-type region 50P exposed by the second recesses 98 are removed. The first nanostructures 52 may be removed by forming a mask (not shown) over the p-type region 50P and performing an isotropic etching process such as wet etching or the like using etchants which are selective to the materials of the first nanostructures 52, while the second nanostructures 54, the substrate 50, the STI regions 68 remain relatively unetched as compared to the first nanostructures 52. In embodiments in which the first nanostructures 52 include, e.g., SiGe, and the second nanostructures 54A-54C include, e.g., Si or SiC, tetramethylammonium hydroxide (TMAH), ammonium hydroxide ($NH_4OH$), or the like may be used to remove the first nanostructures 52 in the n-type region 50N.

The second nanostructures 54 in the p-type region 50P may be removed by forming a mask (not shown) over the n-type region 50N and performing an isotropic etching process such as wet etching or the like using etchants which are selective to the materials of the second nanostructures 54, while the first nanostructures 52, the substrate 50, the STI regions 68 remain relatively unetched as compared to the second nanostructures 54. In embodiments in which the second nanostructures 54 include, e.g., Si or SiC, and the first nanostructures 52 include, e.g., SiGe, hydrogen fluoride, another fluorine-based etchant, or the like may be used to remove the second nanostructures 54 in the p-type region 50P.

In other embodiments, the channel regions in the n-type region 50N and the p-type region 50P may be formed simultaneously, for example by removing the first nanostructures 52 in both the n-type region 50N and the p-type region 50P or by removing the second nanostructures 54 in both the n-type region 50N and the p-type region 50P. In such embodiments, channel regions of n-type nano-FETs and p-type nano-FETS may have a same material composition, such as silicon, silicon germanium, or the like. FIGS. 22A, 22B, and 22C illustrate a structure resulting from such embodiments where the channel regions in both the p-type region 50P and the n-type region 50N are provided by the second nanostructures 54 and comprise silicon, for example.

Figure 17A:
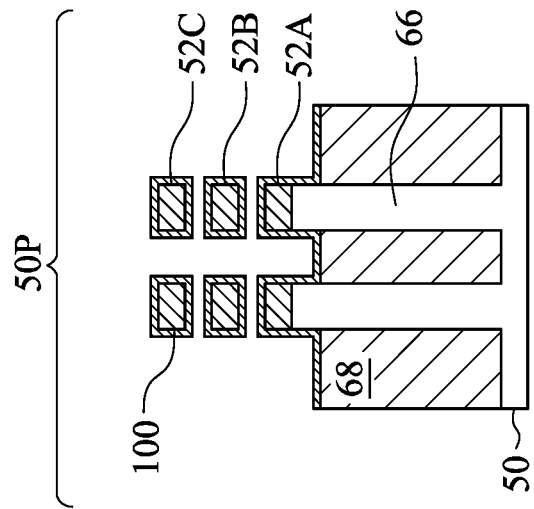
Figure 17A:
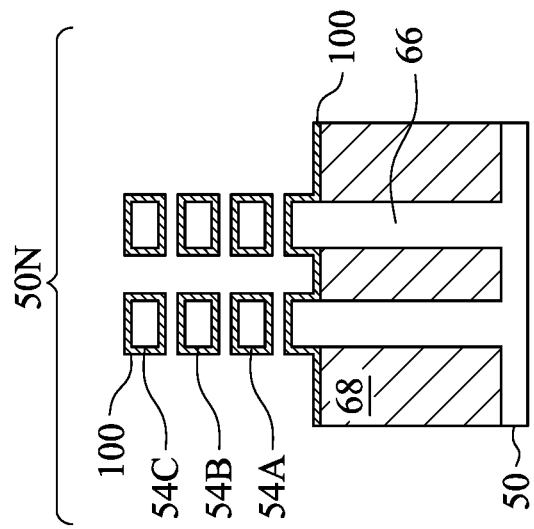
Figure 17B:
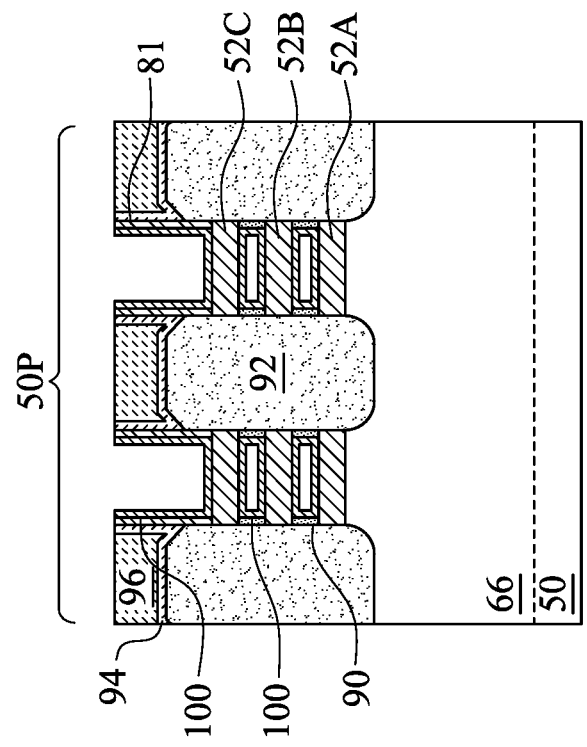
Figure 17B:
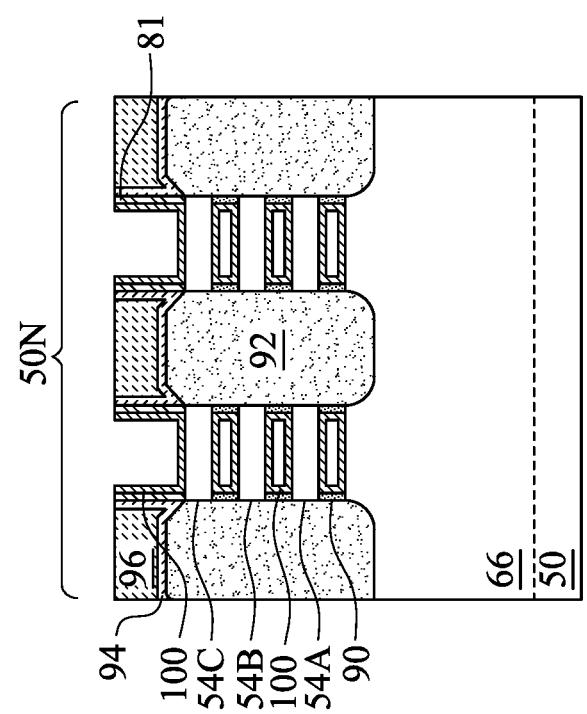
Figure 17C:
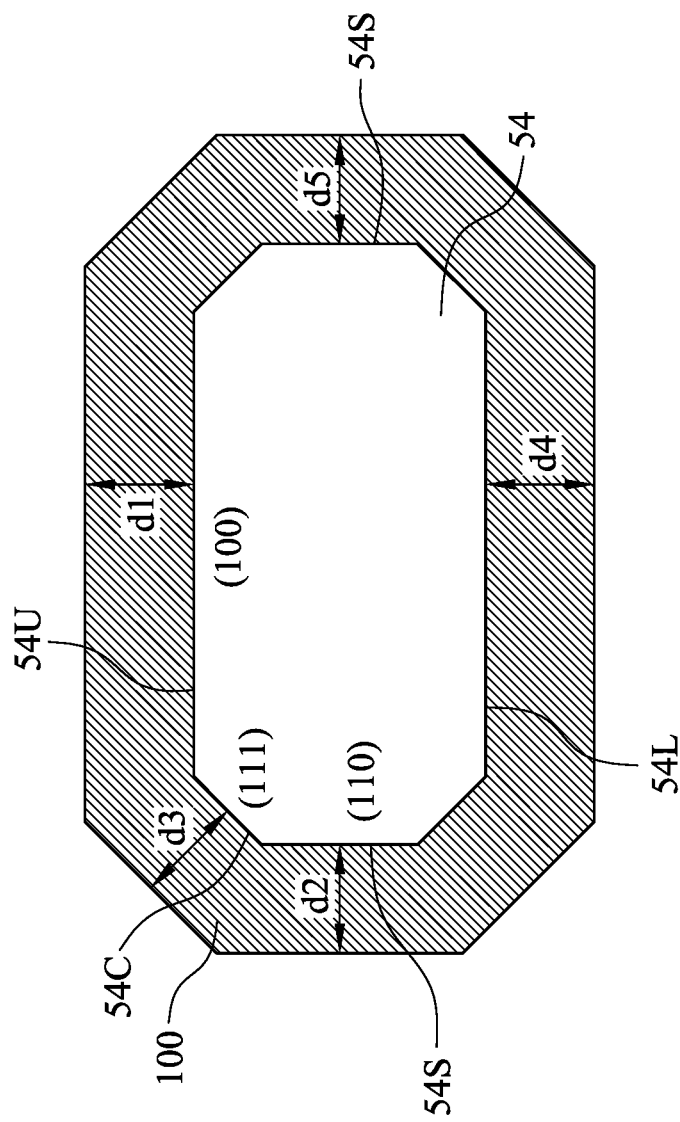

In FIGS. 17A and 17B, a gate dielectric layer 100 is formed (e.g., conformally) in the second recesses 98, e.g., around the second nanostructures 54 in the n-type region 50N and around the first nanostructures 52 in the p-type region 50P. As illustrated in FIG. 17A, the gate dielectric layer 100 is also formed to extend along upper surfaces of the STI regions 68 and along sidewalls and upper surfaces of the fins 66 in the n-type region 50N. Note that in the p-type region 50P, the lowermost first nanostructures 52A are disposed directly on (e.g., in contact with) the upper surfaces of the fins 66, and therefore, the gate dielectric layer 100 extends along sidewalls of the fins 66, sidewalls of the lowermost first nanostructures 52A, and upper surfaces of the lowermost first nanostructures 52A. The gate dielectric layer 100 may also be deposited on top surfaces of the first ILD 96, the CESL 94, and the first spacers 81. Various embodiments methods for forming the gate dielectric layer 100 are discussed below in details.

FIG. 17C illustrates a zoomed-in view of one of the second nanostructures 54 in FIG. 17A and the gate dielectric layer 100 around the second nanostructure 54. As illustrated in the example of FIG. 17C, the second nanostructure 54 has an upper surface 54U, a lower surface 54L, and sidewalls 54S. FIG. 17C further illustrates chamfers 54C (e.g., bevels) connecting the upper surface 54U and the sidewalls 54S, and connecting the lower surface 54L and the sidewalls 54S. The different surfaces of the second nanostructure 54 may result from the different etch rates of the different surfaces. In some embodiments, the semiconductor material (e.g., Si) of the second nanostructure 54 has different crystal orientations at different surfaces of the second nanostructure. For example, the upper surface 54U, the chamfer 54C, and the sidewall 54S of the second nanostructure 54 in FIG. 17C have crystal orientations of (100), (111), and (110), respectively. In some embodiments, the atomic densities of the semiconductor material (e.g., Si) of the second nanostructure 54 along different crystal orientations are different, and therefore, different surfaces (e.g., upper surface 54U, chamfer 54C, and sidewall 54S) of the second nanostructure 54 have different atomic densities of the semiconductor material (e.g., Si). For example, the atomic density of silicon (Si) along the (100) direction is about $6.78 \times 10^{14}$ atoms/$cm^3$, and the atomic density of silicon along the (110) direction is about $9.6 \times 10^{14}$ atoms/$cm^3$. Therefore, in the example of FIG. 17C, the atomic density of Si at the upper surface 54U is less than 75% (e.g., about 71%) of the atomic density of Si at the sidewall 54S. For ease of discussion, the effect of different atomic densities at different surfaces of the nanostructures (e.g., 54 or 52) caused by different crystal orientations is also referred to as the crystal orientation effect. For the first nanostructures 52 in the p-type region 50P, similar crystal orientation effect exists, as skilled artisans readily appreciate. For example, the atomic density of Si, and/or the atomic density of Ge, may be different at different surfaces of the first nanostructure 52 (e.g., SiGe).

In some embodiments, the gate dielectric layer 100 is formed by converting an exterior layer of the nanostructures (e.g., 54 or 52) into an oxide (e.g., silicon oxide, or silicon germanium oxide) of the semiconductor material (e.g., Si, or SiGe) of the nanostructures, e.g., by performing an oxidization process. The relatively large differences in the atomic densities of the semiconductor material (e.g., Si, or SiGe) at different surfaces of the nanostructure (e.g., 54 or 52) may pose a challenge for achieving a substantially uniform thickness for the gate dielectric layer 100. A non-uniform thickness of the gate dielectric layer 100 may cause performance issues for the device formed, such as non-uniform threshold voltage Vt and/or drain-induced barrier lowering (DIBL). Various embodiments methods are discussed below that overcome the crystal orientation effect and achieve a substantially uniform thickness for the gate dielectric layer 100. For simplicity, the various embodiment methods below discuss forming the gate dielectric layer 100 around the second nanostructures 54 as non-limiting examples, with the understanding that the same processing can be performed for the first nanostructures 52 to form the gate dielectric layer 100 around the first nanostructures 52.

In an embodiment, the gate dielectric layer 100 is formed by a remote plasma process. Oxygen radicals O* (which are electrically neutral) generated in a remote plasma chamber is supplied to the process chamber in which the nano-FET device is located. In the process chamber, the oxygen radicals react with (e.g., oxidize) the exterior layer of the second nanostructure 54 (e.g., Si) to form an oxide (e.g., $SiO_2$) of the semiconductor material (e.g., Si) of the second nanostructure 54 as the gate dielectric layer 100. In some embodiments, ions (e.g., oxygen ions, which are electrically charged) generated in the remote plasma chamber are removed from the remote plasma source, and therefore, only the radicals (e.g., oxygen radicals) in the remote plasma chamber are extracted and supplied to the process chamber to react with the second nanostructure 54 to form the gate dielectric layer 100. Unlike ions (which tend to exhibit a directional behavior), the oxygen radicals are neutral, and therefore, are conducive to forming the gate dielectric layer 100 with a substantially uniform thickness.

In some embodiments, the remote plasma process is performed using a gas source comprising an oxygen gas (e.g., $O_2$) and a carrier gas (e.g., Ar, He, $N_2$, Kr, Xe, or $H_2$). For example, the gas source may comprise a mixture of Ar (or Kr, or Xe) and $O_2$, where the flow rate of Ar (or Kr, or Xe) is between 0 slm and 27 slm, the flow rate of $O_2$ is between 3 slm and 30 slm, with a mixing ratio (e.g., ratio of the flow rates) between Ar (or Kr, or Xe) and $O_2$ being between 0% and 90%. As another example, the gas source may comprise a mixture of $H_2$ and $O_2$, where the flow rate of $H_2$ is between 0 slm and 19 slm, the flow rate of $O_2$ is between 1 slm and 20 slm, with a mixing ratio (e.g., ratio of the flow rates) between $H_2$ and $O_2$ being between 5% and 95%. In some embodiments, the RF power of the RF source for generating the remote plasma source in the remote plasma chamber is between 200 W and 2000 W. In some embodiments, the pressure of the process chamber is between 0.5 Torr and 10 Torr. In some embodiments, the temperature of the process chamber and the duration (also referred to as the process time, which refers to the duration during which the RF source is turned on in the remote plasma chamber to generate the remote plasma) of the remote plasma process are adjusted to achieve a target energy level for the oxygen radicals. For example, a higher temperature and a shorter duration, or a lower temperature and a longer duration, may be used for the remote plasma process. Example combinations of temperature and process time include: temperature between 650° C. and 850° C. with process time at about 3 seconds, temperature between 450° C. and 650° C. with process time at about 120 seconds, and temperature between 350° C. and 550° C. with process time at about 1200 seconds. Besides temperature and process time, the pressure of the process chamber may also be adjusted to control the energy level of the oxygen radicals. For example, lowering the pressure may increase the energy level of the oxygen radicals due to less molecular collision.

In some embodiments, the energy level E of the oxygen radicals used in the remote plasma process is controlled to be low, such as lower than 2 eV (e.g., $0<E<2$ eV). The low energy level of the oxygen radicals is conducive to forming the gate dielectric layer 100 with a substantially uniform thickness. Without being limited to a particular theory, it is believed that the activation energy needed to break the Si-Si bond and start the oxidization process varies with the crystal orientation of silicon. For example, the activation energy for a crystal orientation (e.g., (110) direction) having a higher atomic density of Si may be in a first range, and the activation energy for a crystal orientation (e.g., (100) direction) having a lower atomic density of Si may be in a second range, where the second range may overlap with the first range, but the upper limit of the first range is higher than the upper limit of the second range. Therefore, by choosing the energy level E (e.g., $0<E<2$ eV) of the oxygen radicals to be within the first range, some portions of the silicon atoms at surfaces of the second nanostructure 54 having high atomic density of Si will not react with the oxygen radicals to form silicon oxide, which balance out the higher atomic densities of Si (which would otherwise cause more oxide to be formed) at those surfaces. As a result, a substantially uniform thickness for the gate dielectric layer 100 is achieved at all surfaces of the second nanostructure 54. As illustrated in FIG. 17C, the gate dielectric layer 100 is conformal, and has a substantially uniform thickness at all surfaces (e.g., 54U, 54L, 54S, and 54C). In the illustrated embodiment, a conformality of the gate dielectric layer 100 is higher than 99%. The conformality may be calculated as a ratio between a first value and a second value, where the first value is the sum of a thickness d1 and a thickness d4 of the gate dielectric layer 100, measured at the upper surface 54U and the lower surface 54L of the second nanostructure 54, respectively. The second value is the sum of a thickness d2 and a thickness d5 of the gate dielectric layer 100, measured at a first sidewalls 54S and an opposing second sidewall 54S of the second nanostructure 54. In other words, the conformality of the gate dielectric layer 100, which is denoted as C, may be calculated as $C=(d1+d4)/(d2+d5)$, and $100\% \geq C \geq 99\%$. In some embodiments, the conformality of the gate dielectric layer 100 may also be calculated as $C=d4/d1$, and $100\% \geq C \geq 99\%$. In some embodiments, the conformality of the gate dielectric layer 100 being higher than 99% may be interpreted as the thicknesses of the gate dielectric layer 100 at all surfaces (e.g., 54U, 54L, 54S, 54C) of the second nanostructure 54 are within 1% of each other. In some embodiments, the gate dielectric layer 100 at the surfaces (e.g., 54U, 54L, 54S, 54C) of the second nanostructure 54 has an average thickness between 1.0 nm and 8 nm, with variations from the average thickness being less than 0.05 nm.

In some embodiments, the gate dielectric layer 100 is formed by performing a thermal process, such as rapid thermal processing (RTP), rapid thermal anneal (RTA), rapid thermal oxidization (RTO), or in-situ steam generation (ISSG) process. In the illustrated embodiments, the thermal process uses a gas source comprising oxygen gas ($O_2$) to oxidize the material (e.g., Si) of the second nanostructure 54. The thermal process may use a gas source comprising $O_2$ and a carrier gas, such as Ar, He, Kr, Xe, He, $N_2$, or the like. As an example, the gas source is a mixture of $O_2$ and a carrier gas Ar (or $N_2$, or Kr, or Ke), where a flow rate of $O_2$ is between 3.0 slm and 30 slm, a flow rate of the carrier gas Ar (or $N_2$, or Kr, or Ke) is between 0 slm and 27 slm, with the mixing ratio between the carrier gas and $O_2$ being between 0% and 90%. As another example, the gas source is a mixture of $O_2$ and a carrier gas He, where a flow rate of $O_2$ is between 6 slm and 30 slm, a flow rate of the carrier gas He is between 0 slm and 24 slm, with the mixing ratio between the carrier gas He and $O_2$ being between 0% and 80%.

In some embodiments, the thermal process is a wet oxidization process such as an ISSG process. In an example ISSG process, the gas source comprises hydrogen gas ($H_2$)

and oxygen gas ($O_2$). In some embodiments, the mixture of $H_2$ and $O_2$ flows across a rotating wafer (on which the nano-FETs are formed) heated by, e.g., tungsten-halogen lamps. The reaction between $H_2$ and $O_2$ occurs close to the wafer surface because the hot wafer acts as the ignition source. During the ISSG process, $H_2$ and $O_2$ combine to generate water in the form of steam, and oxygen radials are generated by the ISSG process. The oxygen radicals react with the material (e.g., Si) of the second nanostructure 54 to form an oxide (e.g., $SiO_2$) as the gate dielectric layer 100. Note that in the example ISSG process, no oxygen ions are generated. The temperature of the ISSG process may be tuned to adjust the energy level E of the oxygen radicals to be low, (e.g., $0<E<2$ eV) to facilitate formation of the gate dielectric layer 100 with a substantially uniform thickness, in some embodiments. A temperature of the ISSG process may be between 550° C. and 850° C., a duration of the ISSG process may be between 1 second and 180 second, and a pressure of the ISSG process may be between 30 mTorr and 20 Torr.

In some embodiments, the gate dielectric layer 100 is formed by a suitable atomic layer deposition (ALD) process, such as thermal ALD process, or plasma-enhanced ALD (PEALD) process. The ALD process, with one monolayer of the gate oxide being deposited in each cycle of the ALD process, may help to overcome the crystal orientation effect and achieve a substantially uniform thickness for the gate dielectric layer 100. In an example embodiment, a thermal ALD process is used to form the gate dielectric layer 100. The thermal ALD process includes multiple cycles, and each cycle includes four processing steps. In the first step of each cycle, a silicon-containing precursor, such as Bis(diethylamino)silane (BDEAS), $SiH_4$, $Si_2H_6$, or $Si_3H_8$, is supplied into the process chamber in which the nano-FET device is located. A carrier gas, such as Ar, He, Kr, Xe, or $N_2$, may be used to carry the silico-containing precursor into the process chamber. In the second step of each cycle, un-used precursors and/or by-products (if any) are evacuated from (e.g., pumped out of) the process chamber. In the third step of each cycle, an oxidant (e.g., $O_2$, $O_3$, or $H_2O$) is supplied into the process chamber. A carrier gas, such as Ar, He, Kr, Xe, or $N_2$, may be used to carry the oxidant into the process chamber. In the fourth step of each cycle, un-used oxidants and/or by-products (if any) are evacuated from (e.g., pumped out of) the process chamber. Each of the four process steps may last between 0.1 second and 10 second. Although oxide (e.g., silicon oxide for the second nanostructure 54, or silicon germanium oxide for the first nanostructure 52) of the material of the nanostructures (e.g., 54, or 52) is formed in the above example as the gate dielectric layer 100, the ALD process discussed above may also be used to form other gate dielectric materials, such as $Al_2O_3$, $HfO_2$, or $Zr_2O_3$, as the gate dielectric layer 100.

Figure 18A:
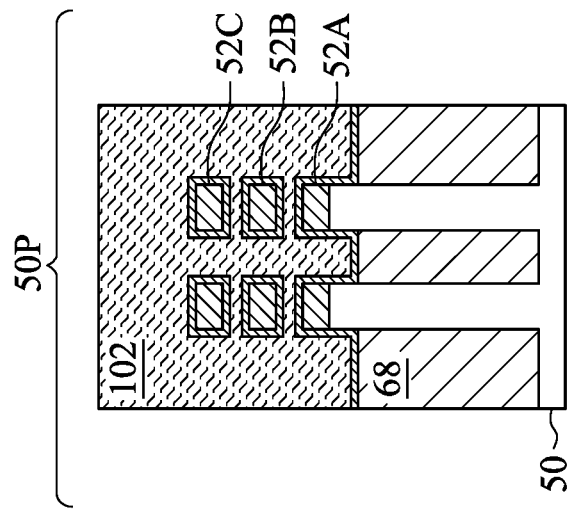
Figure 18A:
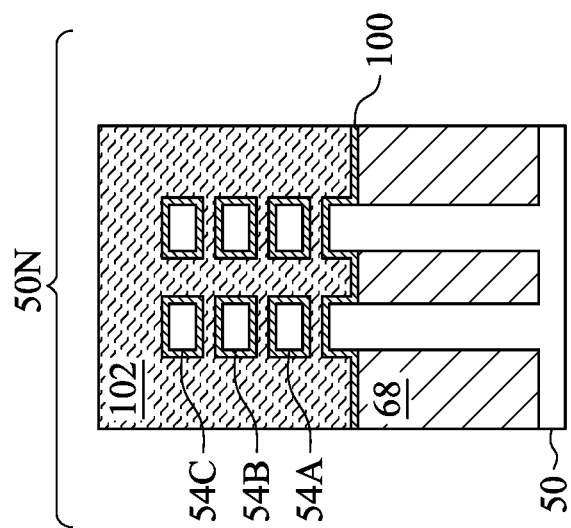
Figure 18B:
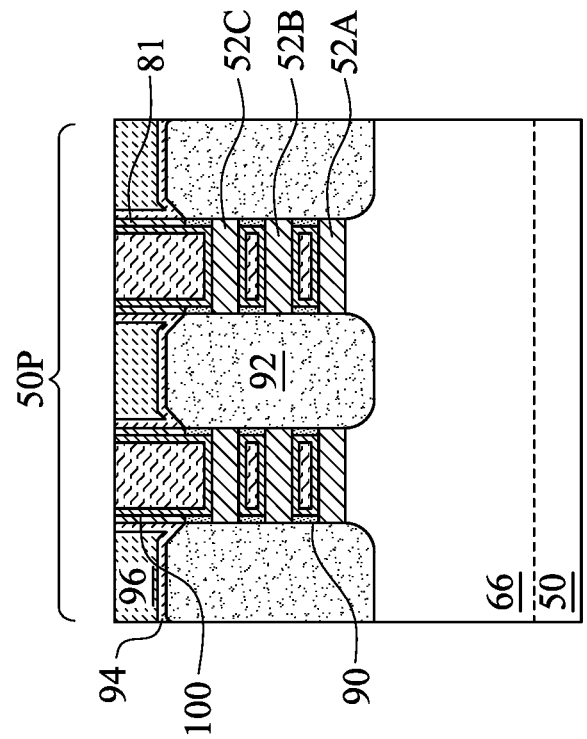
Figure 18B:
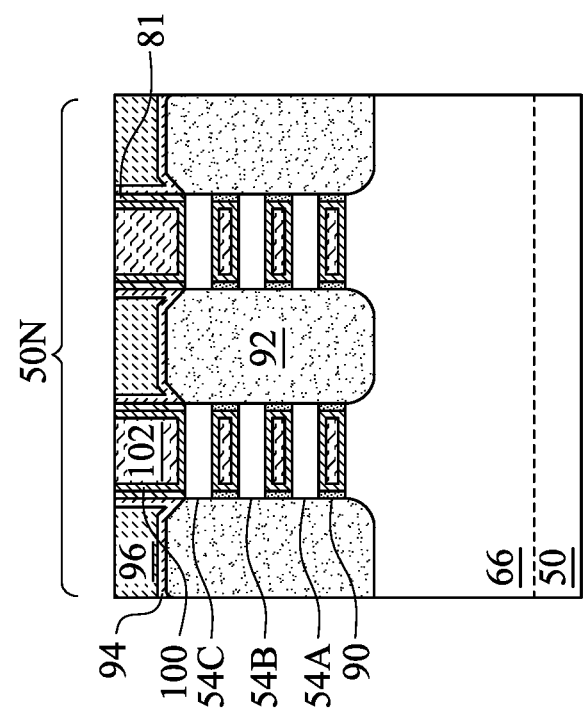

Next, in FIGS. 18A and 18B, gate electrodes 102 are deposited over the gate dielectric layer 100, and fill the remaining portions of the second recesses 98. The gate electrodes 102 may include a metal-containing material such as titanium nitride, titanium oxide, tantalum nitride, tantalum carbide, cobalt, ruthenium, aluminum, tungsten, combinations thereof, or multi-layers thereof. For example, although single layer gate electrodes 102 are illustrated in FIGS. 18A and 18B, the gate electrodes 102 may comprise any number of liner layers, any number of work function tuning layers, and a fill material. Any combination of the layers which make up the gate electrodes 102 may be deposited in the n-type region 50N between adjacent ones of the second nanostructures 54 and between the second nano-structure 54A and the substrate 50, and may be deposited in the p-type region 50P between adjacent ones of the first nanostructures 52.

The formation of the gate electrodes 102 may occur simultaneously such that the gate electrodes 102 in each region are formed from the same materials. In some embodiments, the gate electrodes 102 in each region may be formed by distinct processes, such that the gate electrodes 102 may be different materials and/or have a different number of layers. Various masking steps may be used to mask and expose appropriate regions when using distinct processes.

After the filling of the second recesses 98, a planarization process, such as a CMP, may be performed to remove the excess portions of the gate dielectric layer 100 and the material of the gate electrodes 102, which excess portions are over the top surface of the first ILD 96. The remaining portions of material of the gate electrodes 102 and the gate dielectric layer 100 thus form replacement gate structures of the resulting nano-FETs. The gate electrodes 102 and the gate dielectric layers 100 may be collectively referred to as "gate structures."

Figure 19A:
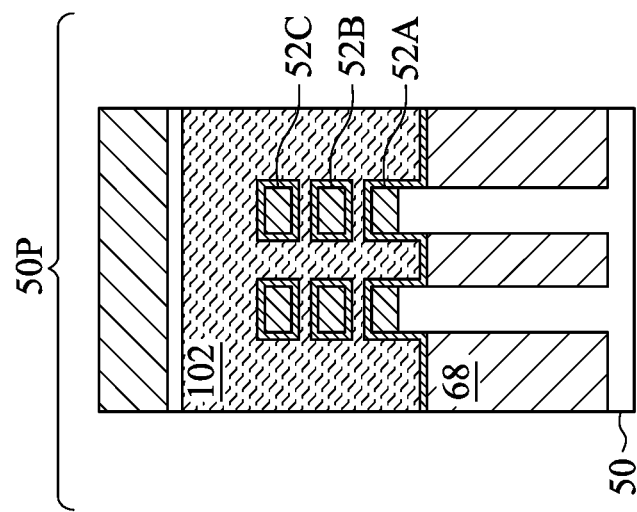
Figure 19A:
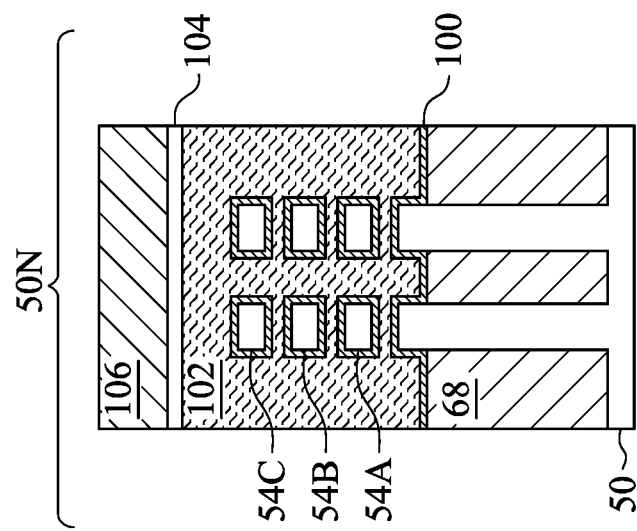
Figure 19B:
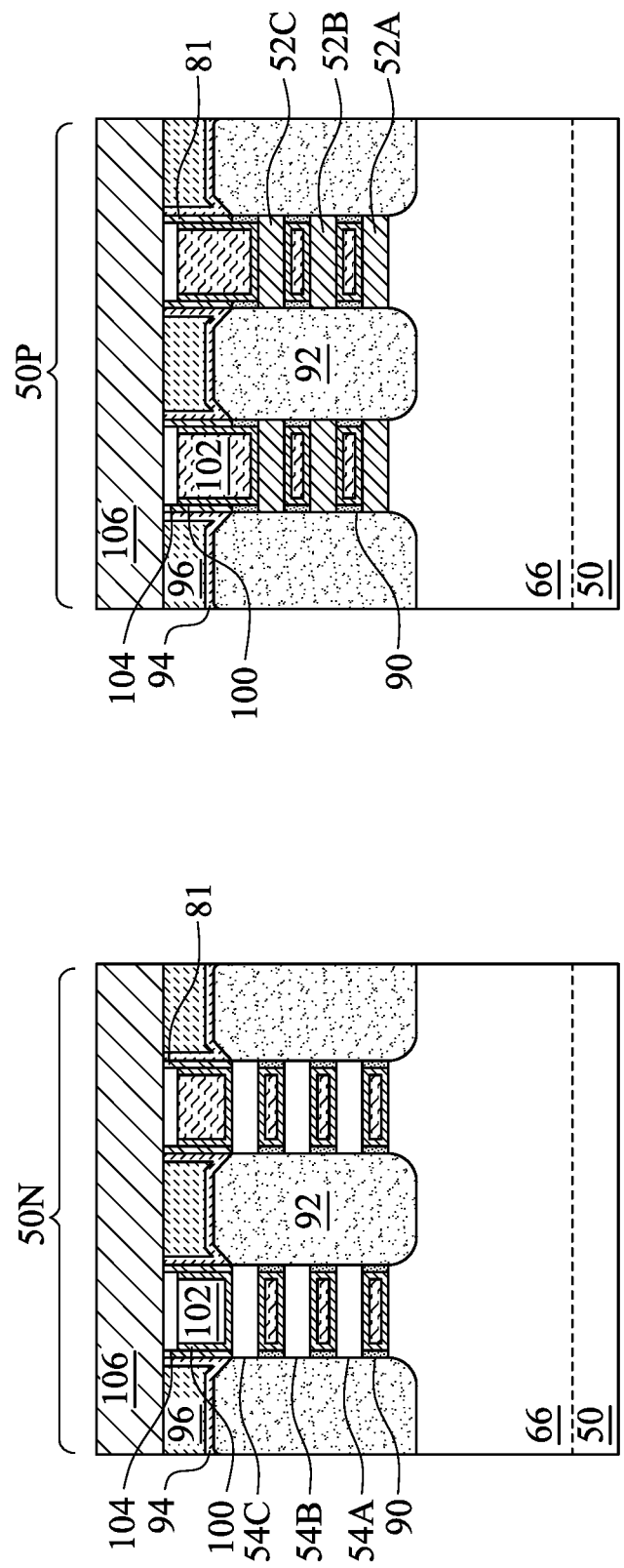
Figure 19C:
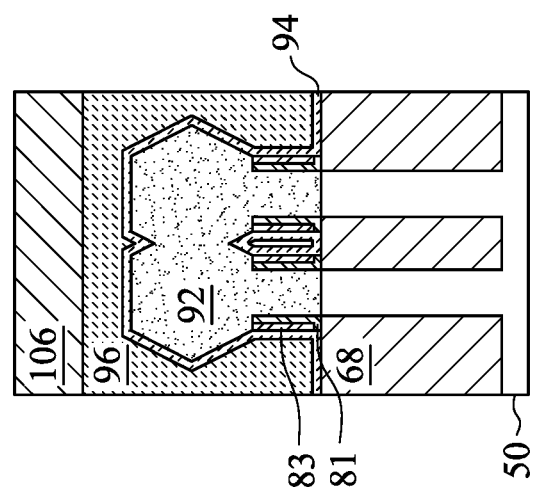

In FIGS. 19A-19C, the gate structure (including the gate dielectric layer 100 and the corresponding overlying gate electrode 102) is recessed, so that a recess is formed directly over the gate structure and between opposing portions of first spacers 81. A gate mask 104 comprising one or more layers of dielectric material, such as silicon nitride, silicon oxynitride, or the like, is filled in the recess, followed by a planarization process to remove excess portions of the dielectric material extending over the first ILD 96. Subsequently formed gate contacts (such as the gate contacts 114, discussed below with respect to FIG. 21A) penetrate through the gate mask 104 to contact the top surface of the recessed gate electrodes 102.

As further illustrated by FIGS. 19A-19C, a second ILD 106 is deposited over the first ILD 96 and over the gate mask 104. In some embodiments, the second ILD 106 is a flowable film formed by FCVD. In some embodiments, the second ILD 106 is formed of a dielectric material such as PSG, BSG, BPSG, USG, or the like, and may be deposited by any suitable method, such as CVD, PECVD, or the like.

Figure 20A:
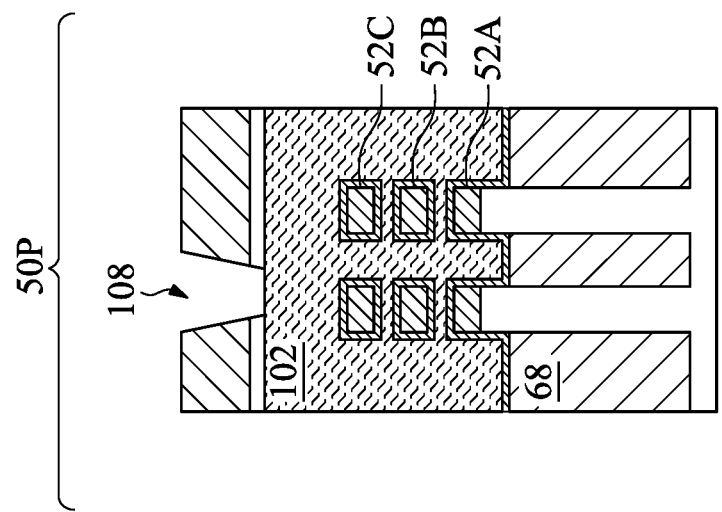
Figure 20A:
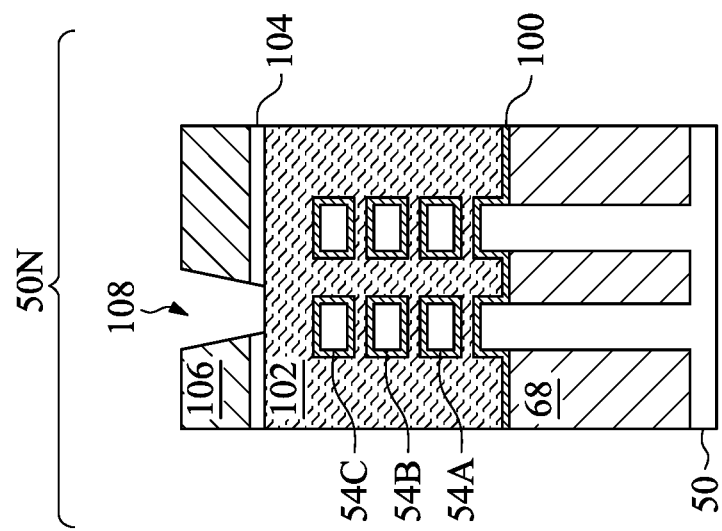
Figure 20B:
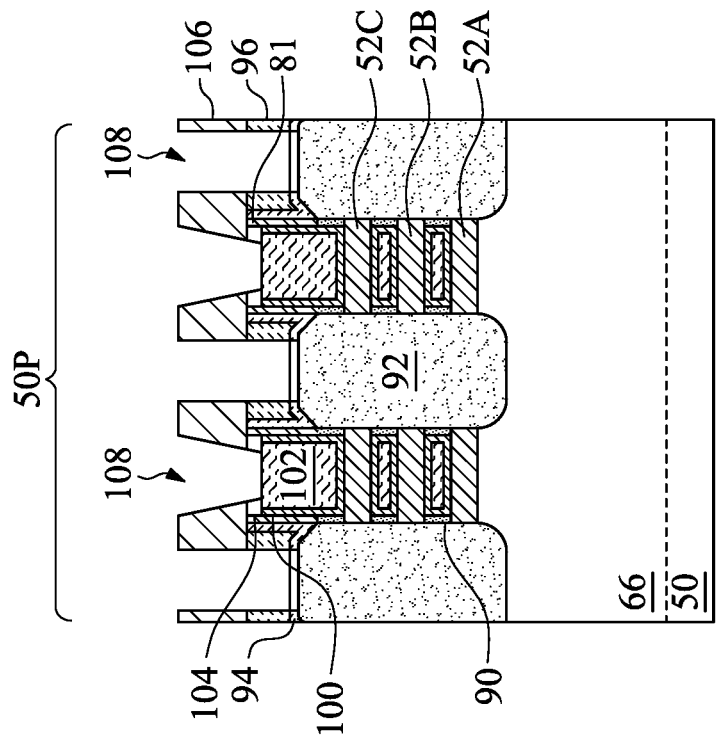
Figure 20B:
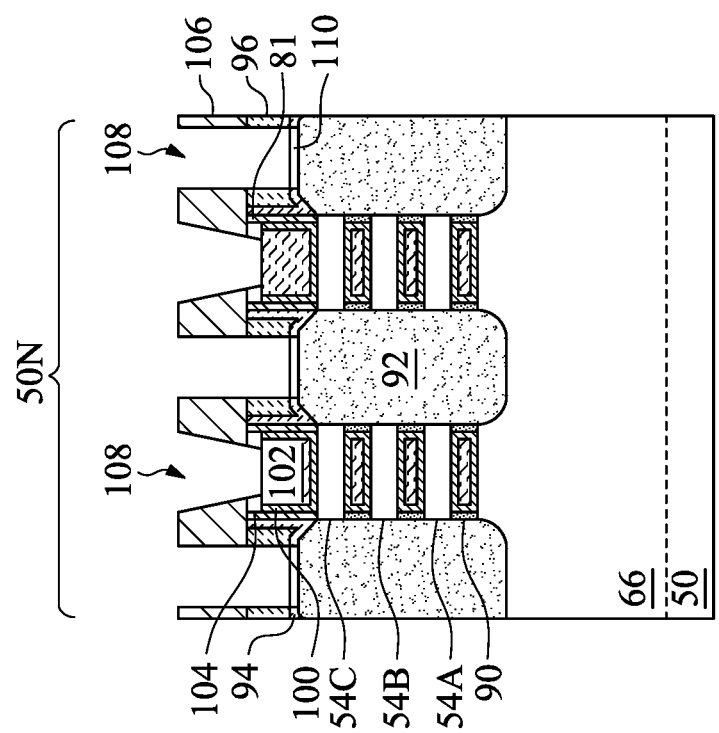
Figure 20C:
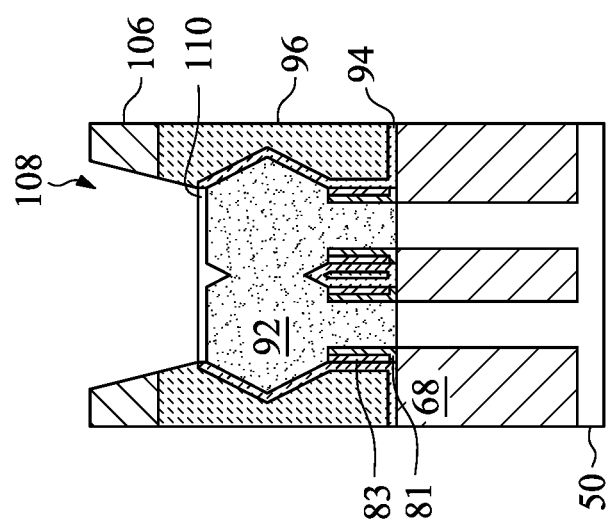

In FIGS. 20A-20C, the second ILD 106, the first ILD 96, the CESL 94, and the gate masks 104 are etched to form third recesses 108 exposing surfaces of the epitaxial source/drain regions 92 and/or the gate structure. The third recesses 108 may be formed by etching using an anisotropic etching process, such as RIE, NBE, or the like. In some embodiments, the third recesses 108 may be etched through the second ILD 106 and the first ILD 96 using a first etching process; may be etched through the gate masks 104 using a second etching process; and may then be etched through the CESL 94 using a third etching process. A mask, such as a photoresist, may be formed and patterned over the second ILD 106 to mask portions of the second ILD 106 from the first etching process and the second etching process. In some embodiments, the etching process may over-etch, and therefore, the third recesses 108 extend into the epitaxial source/drain regions 92 and/or the gate structure, and a bottom of the third recesses 108 may be level with (e.g., at a same level, or having a same distance from the substrate), or lower than (e.g., closer to the substrate) the epitaxial source/drain regions 92 and/or the gate structure. Although FIG. 20B illustrates the third recesses 108 as exposing the epitaxial source/drain regions 92 and the gate structure in a same cross section, in various embodiments, the epitaxial source/drain regions 92 and the gate structure may be exposed in different cross-sections, thereby reducing the risk of shorting subsequently formed contacts. After the third recesses 108 are formed, silicide regions 110 are formed over the epitaxial source/drain regions 92. In some embodiments, the silicide regions 110 are formed by first depositing a metal (not shown) capable of reacting with the semiconductor materials of the underlying epitaxial source/drain regions 92 (e.g., silicon, silicon germanium, germanium) to form silicide or germanide regions, such as nickel, cobalt, titanium, tantalum, platinum, tungsten, other noble metals, other refractory metals, rare earth metals or their alloys, over the exposed portions of the epitaxial source/drain regions 92, then performing a thermal anneal process to form the silicide regions 110. The un-reacted portions of the deposited metal are then removed, e.g., by an etching process. Although silicide regions 110 are referred to as silicide regions, silicide regions 110 may also be germanide regions, or silicon germanide regions (e.g., regions comprising silicide and germanide). In an embodiment, the silicide region 110 comprises TiSi, and has a thickness in a range between about 2 nm and about 10 nm.

Figure 21A:
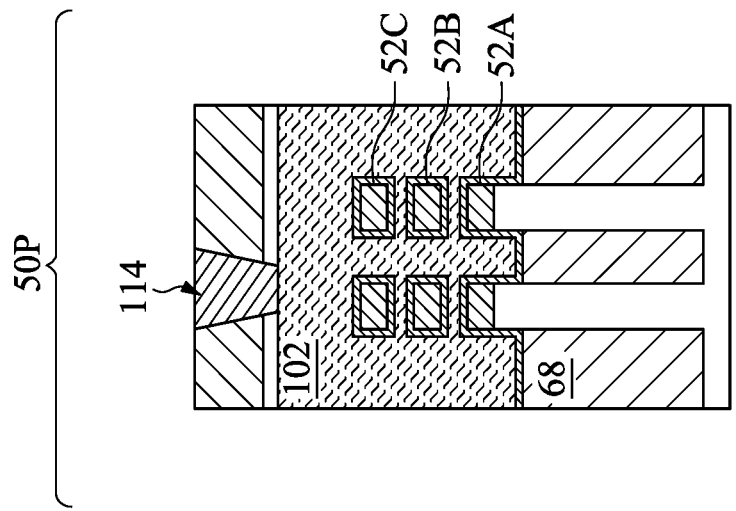
Figure 21A:
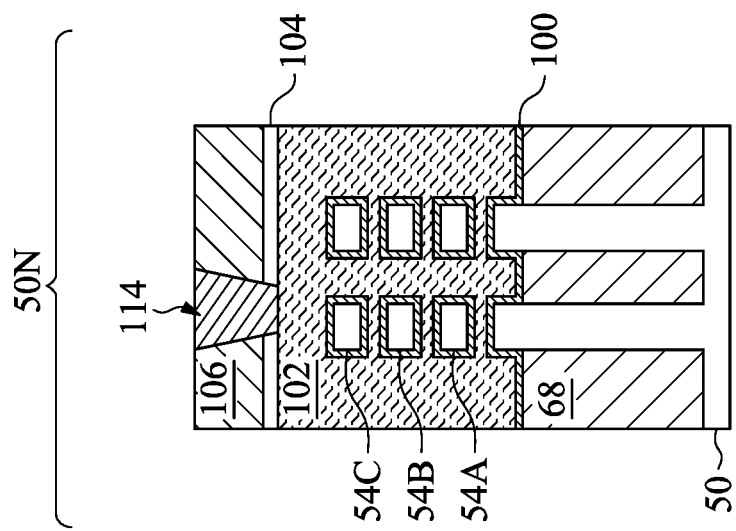
Figure 21B:
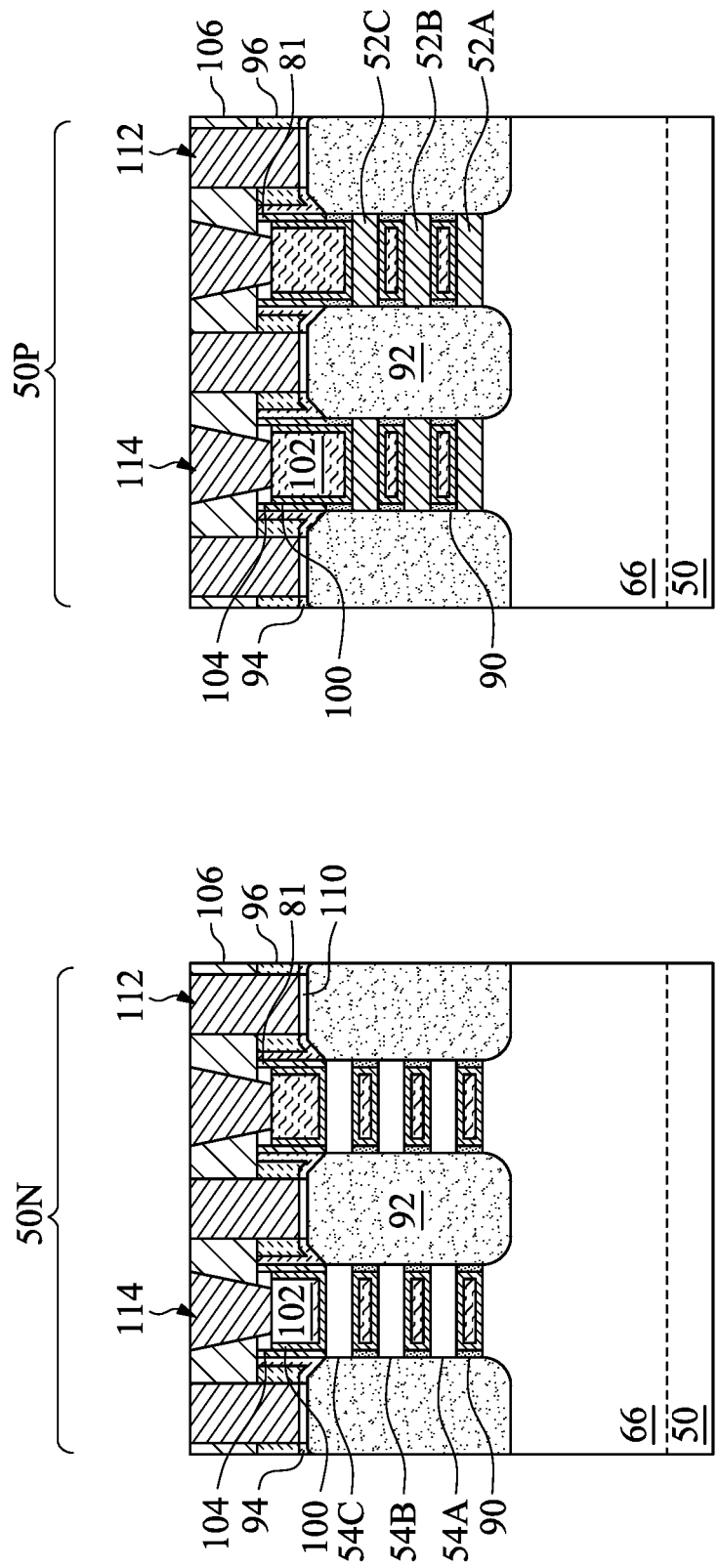
Figure 21C:
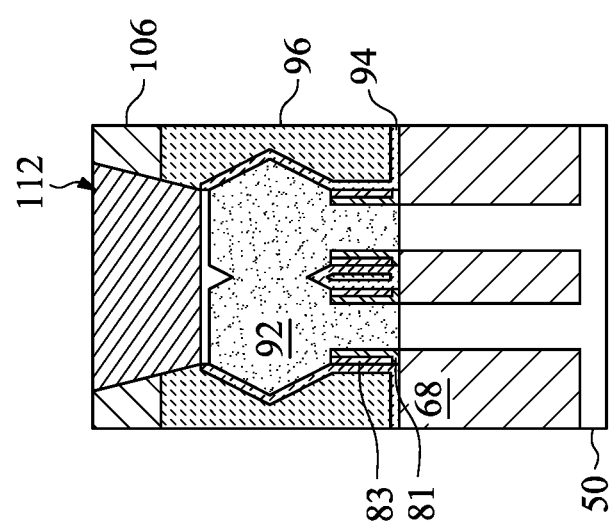

Next, in FIGS. 21A-21C, contacts 112 and 114 (may also be referred to as contact plugs) are formed in the third recesses 108. The contacts 112 and 114 may each comprise one or more layers, such as barrier layers, diffusion layers, and fill materials. In some embodiments, the contacts 112 and 114 each includes a barrier layer and a conductive material, and is electrically coupled to the underlying conductive feature (e.g., gate electrode 102 and/or silicide region 110). The contacts 114 are electrically coupled to the gate electrodes 102 and may be referred to as gate contacts, and the contacts 112 are electrically coupled to the silicide regions 110 and may be referred to as source/drain contacts. The barrier layer of the contacts 112/114 may include titanium, titanium nitride, tantalum, tantalum nitride, or the like. The conductive material of the contacts 112/114 may be copper, a copper alloy, silver, gold, tungsten, cobalt, aluminum, nickel, or the like. A planarization process, such as a CMP, may be performed to remove excess material from the upper surface of the second ILD 106.

FIGS. 22A-22C illustrate cross-sectional views of a device according to some alternative embodiments. FIG. 22A illustrates reference cross-section A-A' illustrated in FIG. 1. FIG. 22B illustrates reference cross-section B-B' illustrated in FIG. 1. FIG. 22C illustrates reference cross-section C-C' illustrated in FIG. 1. In FIGS. 22A-22C, like reference numerals indicate like elements formed by like processes as the structure of FIGS. 21A-21C. However, in FIGS. 22A-22C, channel regions in the n-type region 50N and the p-type region 50P comprise a same material. For example, the second nanostructures 54, which comprise silicon, provide channel regions for p-type nano-FETs in the p-type region 50P and for n-type nano-FETs in the n-type region 50N. The structure of FIGS. 22A-22C may be formed, for example, by removing the first nanostructures 52 from both the p-type region 50P and the n-type region 50N simultaneously; forming the gate dielectric layer 100 and the gate electrodes 102P (e.g., gate electrode suitable for a p-type nano-FET) around the second nanostructures 54 in the p-type region 50P; and forming the gate dielectric layer 100 and the gate electrodes 102N (e.g., a gate electrode suitable for a n-type nano-FET) around the second nanostructures 54 in the n-type region 50N. In such embodiments, materials of the epitaxial source/drain regions 92 may be different in the n-type region 50N compared to the p-type region 50P as explained above.

Embodiments may achieve advantages. For example, the disclosed methods for forming the gate dielectric layer 100 overcome the crystal orientation effect, and achieves substantially uniform thickness for the gate dielectric layer 100. As a result, issues such as non-uniform threshold and/or drain-induced barrier lowering are alleviated or avoided, and the performance of the device formed is improved.

FIG. 23 illustrates a flow chart of a method of forming a nanostructure field-effect transistor (nano-FET) device, in accordance with some embodiments. It should be understood that the embodiment method shown in FIG. 23 is merely an example of many possible embodiment methods. One of ordinary skill in the art would recognize many variations, alternatives, and modifications. For example, various steps as illustrated in FIG. 23 may be added, removed, replaced, rearranged, or repeated.

Referring to FIG. 23, at block 1010, a dummy gate structure is formed over a fin structure that protrudes above a substrate, wherein the fin structure comprises a fin and alternating layers of a first semiconductor material and a second semiconductor material overlying the fin. At block 1020, a dielectric layer is formed over the fin structure and around the dummy gate structure. At block 1030, the dummy gate structure is replaced with a replacement gate structure, comprising: removing the dummy gate structure to form a recess in the dielectric layer, wherein the recess exposes the first semiconductor material and the second semiconductor material under the dummy gate structure; selectively removing the first semiconductor material exposed by the recess, wherein the second semiconductor material in the recess remains and forms nanostructures, wherein different surfaces of the nanostructures have different atomic densities of the second semiconductor material; forming a gate dielectric layer by converting an exterior layer of the nanostructures into an oxide of the second semiconductor material, wherein a conformality of the gate dielectric layer is larger than 99%; and forming a gate electrode around the gate dielectric layer.

In an embodiment, a method of forming a nanostructure field-effect transistor (nano-FET) device includes: forming a fin structure protruding above a substrate, wherein the fin structure comprises a fin and alternating layers of a first semiconductor material and a second semiconductor material overlying the fin; forming a dummy gate structure over the fin structure; forming source/drain regions over the fin structure on opposing sides of the dummy gate structure; removing the dummy gate structure to expose the first semiconductor material and the second semiconductor material under the dummy gate structure; after removing the dummy gate structure, selectively removing the exposed first semiconductor material, wherein after the selectively removing, the exposed second semiconductor material remains to form nanostructures, wherein different surfaces of the nanostructures have different atomic densities of the second semiconductor material; forming a gate dielectric layer around the nanostructures, wherein thicknesses of the gate dielectric layer on the different surfaces of the nanostructures are formed to be substantially the same; and forming a gate electrode around the gate dielectric layer. In an embodiment, a conformality of the gate dielectric layer is formed to be higher than 99%, wherein the conformality of the gate dielectric layer is calculated as a ratio between a first value and a second value, wherein the first value is a sum of a first thickness of the gate dielectric layer at an upper surface of a first nanostructure of the nanostructures and a second thickness of the gate dielectric layer at a lower surface of the first nanostructure, wherein the second value is a sum of a third thickness of the gate dielectric layer at a first sidewall of the first nanostructure and a fourth thickness of the gate dielectric layer at an opposing second sidewall of the first nanostructure. In an embodiment, the upper surface of the first nanostructure has a first atomic density of the second semiconductor material, and the first sidewall of the first nanostructure has a second atomic density of the second semiconductor material, wherein the first atomic density is less than 75% of the second atomic density. In an embodiment, the first nanostructure is formed to have a chamfer between the upper surface and the first sidewall of the first nanostructure, wherein the chamfer has a third atomic density of the second semiconductor material different from the first atomic density and the second atomic density. In an embodiment, the second semiconductor material has a first crystal orientation at the upper surface of the first nanostructure, and has a second crystal orientation at the first sidewall of the first nanostructure, wherein the second crystal orientation is different from the first crystal orientation. In an embodiment, the gate dielectric layer is an oxide of the second semiconductor material, wherein forming the gate dielectric layer comprises converting an exterior layer of the nanostructures into the oxide of the second semiconductor material. In an embodiment, converting the exterior layer of the nanostructures comprises performing a remote plasma process, wherein oxygen radicals of the remote plasma process react with the exterior layer of the nanostructures to form the oxide of the second semiconductor material. In an embodiment, the oxygen radicals of the remote plasma process have an energy level less than 2 eV. In an embodiment, converting the exterior layer of the nanostructures comprises performing a thermal process using a gas source comprising oxygen. In an embodiment, the thermal process is an in-situ steam generation (ISSG) process performed with a gas source comprising a hydrogen gas and an oxygen gas, wherein a mixing ratio between the hydrogen gas and the oxygen gas is between 0.33% and 33%, a temperature of the ISSG process is between 550° C. and 850° C., a pressure of the ISSG process is between 30 mTorr and 760 Torr, and a duration of the ISSG process is between 1 second and 180 seconds. In an embodiment, forming the gate dielectric layer comprises depositing the gate dielectric layer around the nanostructures using a plasma-enhanced atomic layer deposition (PEALD) process, wherein a pressure of the PEALD process is between 500 mTorr and 5 Torr, a power of the PEALD process is between 10 W and 1000 W, and a temperature of the PEALD process is between 160° C. and 520° C.

In an embodiment, a method of forming a nanostructure field-effect transistor (nano-FET) device includes: forming a dummy gate structure over a fin structure that protrudes above a substrate, wherein the fin structure comprises a fin and alternating layers of a first semiconductor material and a second semiconductor material overlying the fin; forming a dielectric layer over the fin structure and around the dummy gate structure; and replacing the dummy gate structure with a replacement gate structure, comprising: removing the dummy gate structure to form a recess in the dielectric layer, wherein the recess exposes the first semiconductor material and the second semiconductor material under the dummy gate structure; selectively removing the first semiconductor material exposed by the recess, wherein the second semiconductor material in the recess remains and forms nanostructures, wherein different surfaces of the nanostructures have different atomic densities of the second semiconductor material; forming a gate dielectric layer by converting an exterior layer of the nanostructures into an oxide of the second semiconductor material, wherein a conformality of the gate dielectric layer is larger than 99%; and forming a gate electrode around the gate dielectric layer.

In an embodiment, the conformality of the gate dielectric layer is calculated as a ratio between a first value and a second value, wherein the first value is a sum of a first thickness and a second thickness of the gate dielectric layer measured at an upper surface and a lower surface, respectively, of a first nanostructure of the nanostructures, wherein the second value is a sum of a third thickness and a fourth thickness of the gate dielectric layer measured at a first sidewall and an opposing second sidewall, respectively, of the first nanostructure. In an embodiment, the second semiconductor material has different crystal orientations at the different surfaces of the nanostructures. In an embodiment, converting the exterior layer of the nanostructures comprises performing a remote plasma process to oxidize the exterior layer of the nanostructures with oxygen radicals, wherein an energy level of the oxygen radicals is below 2 eV. In an embodiment, converting the exterior layer of the nanostructures comprises performing an in-situ steam generation (ISSG) process using a gas source comprising a hydrogen gas and an oxygen gas, wherein a flow rate of the hydrogen gas is between 0.1 standard liters per minute (slm) and 10 slm, a flow rate of the oxygen gas is between 20 slm and 29.9 slm, and a temperature of the ISSG process is between 550° C. and 850° C.

In an embodiment, a nanostructure field-effect transistor (nano-FET) device includes: a fin protruding above a substrate; source/drain regions over the fin; nanostructures between the source/drain regions and extending parallel to the substrate, wherein the nanostructures comprise a semiconductor material, wherein a first surface of a first nanostructure of the nanostructures has a first atomic density of the semiconductor material, and a second surface of the first nanostructure has a second atomic density of the semiconductor material different from the first atomic density; a gate dielectric layer around the nanostructure, wherein a conformality of the gate dielectric layer is larger than 99%; and a gate electrode around the gate dielectric layer. In an embodiment, the conformality of the gate dielectric layer is calculated as a ratio between a first value and a second value, wherein the first value is a sum of a first thickness and a second thickness of the gate dielectric layer measured at an upper surface and a lower surface, respectively, of the first nanostructure, wherein the second value is a sum of a third thickness and a fourth thickness of the gate dielectric layer measured at a first sidewall and an opposing second sidewall, respectively, of the first nanostructure. In an embodiment, the first atomic density is less than 75% of the second atomic density. In an embodiment, the first nanostructure has a chamfer between the first surface and the second surface, wherein the chamfer has a third atomic density of the semiconductor material different from the first and the second atomic densities.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a nanostructure field-effect transistor (nano-FET) device, the method comprising:
    forming a fin structure protruding above a substrate, wherein the fin structure comprises a fin and alternating layers of a first semiconductor material and a second semiconductor material overlying the fin;
    forming a dummy gate structure over the fin structure;
    forming source/drain regions over the fin structure on opposing sides of the dummy gate structure;
    removing the dummy gate structure to expose the first semiconductor material and the second semiconductor material under the dummy gate structure;
    after removing the dummy gate structure, selectively removing the exposed first semiconductor material, wherein after the selectively removing, the exposed second semiconductor material remains to form nanostructures, wherein different surfaces of the nanostructures have different atomic densities of the second semiconductor material, wherein the second semiconductor material has a first crystal orientation at an upper surface of a first nanostructure of the nanostructures, and has a second crystal orientation at a first sidewall of the first nanostructure, wherein the second crystal orientation is different from the first crystal orientation;
    forming a gate dielectric layer around the nanostructures, wherein thicknesses of the gate dielectric layer on the different surfaces of the nanostructures are formed to be substantially the same; and
    forming a gate electrode around the gate dielectric layer.

2. The method of claim 1, wherein a conformality of the gate dielectric layer is formed to be higher than 99%, wherein the conformality of the gate dielectric layer is calculated as a ratio between a first value and a second value, wherein the first value is a sum of a first thickness of the gate dielectric layer at the upper surface of the first nanostructure of the nanostructures and a second thickness of the gate dielectric layer at a lower surface of the first nanostructure, wherein the second value is a sum of a third thickness of the gate dielectric layer at the first sidewall of the first nanostructure and a fourth thickness of the gate dielectric layer at an opposing second sidewall of the first nanostructure.

3. The method of claim 2, wherein the upper surface of the first nanostructure has a first atomic density of the second semiconductor material, and the first sidewall of the first nanostructure has a second atomic density of the second semiconductor material, wherein the first atomic density is less than 75% of the second atomic density.

4. The method of claim 3, wherein the first nanostructure is formed to have a chamfer between the upper surface and the first sidewall of the first nanostructure, wherein the chamfer has a third atomic density of the second semiconductor material different from the first atomic density and the second atomic density.

5. The method of claim 2, wherein the gate dielectric layer is an oxide of the second semiconductor material, wherein forming the gate dielectric layer comprises converting an exterior layer of the nanostructures into the oxide of the second semiconductor material.

6. The method of claim 5, wherein converting the exterior layer of the nanostructures comprises performing a remote plasma process, wherein oxygen radicals of the remote plasma process react with the exterior layer of the nanostructures to form the oxide of the second semiconductor material.

7. The method of claim 6, wherein the oxygen radicals of the remote plasma process have an energy level less than 2 eV.

8. The method of claim 5, wherein converting the exterior layer of the nanostructures comprises performing a thermal process using a gas source comprising oxygen.

9. The method of claim 8, wherein the thermal process is an in-situ steam generation (ISSG) process performed with a gas source comprising a hydrogen gas and an oxygen gas, wherein a mixing ratio between the hydrogen gas and the oxygen gas is between 0.33% and 33%, a temperature of the ISSG process is between 550° C. and 850° C., a pressure of the ISSG process is between 30 mTorr and 760 Torr, and a duration of the ISSG process is between 1 second and 180 seconds.

10. The method of claim 2, wherein forming the gate dielectric layer comprises depositing the gate dielectric layer around the nanostructures using a plasma-enhanced atomic layer deposition (PEALD) process, wherein a pressure of the PEALD process is between 500 mTorr and 5 Torr, a power of the PEALD process is between 10 W and 1000 W, and a temperature of the PEALD process is between 160° C. and 520° C.

11. A method of forming a nanostructure field-effect transistor (nano-FET) device, the method comprising:
    forming a dummy gate structure over a fin structure that protrudes above a substrate, wherein the fin structure comprises a fin and alternating layers of a first semiconductor material and a second semiconductor material overlying the fin;
    forming a dielectric layer over the fin structure and around the dummy gate structure; and
    replacing the dummy gate structure with a replacement gate structure, comprising:
        removing the dummy gate structure to form a recess in the dielectric layer, wherein the recess exposes the first semiconductor material and the second semiconductor material under the dummy gate structure;
        selectively removing the first semiconductor material exposed by the recess, wherein the second semiconductor material in the recess remains and forms nanostructures, wherein an upper surface of a first nanostructure of the nanostructures has a first atomic density of the second semiconductor material, and a first sidewall of the first nanostructure has a second atomic density of the second semiconductor material different from the first atomic density;
        forming a gate dielectric layer by converting an exterior layer of the nanostructures into an oxide of the second semiconductor material; and
        forming a gate electrode around the gate dielectric layer.

12. The method of claim 11, wherein the first atomic density is less than 75% of the second atomic density.

13. The method of claim 11, wherein a conformality of the gate dielectric layer is larger than 99%, wherein the conformality of the gate dielectric layer is calculated as a ratio between a first value and a second value, wherein the first value is a sum of a first thickness and a second thickness of the gate dielectric layer measured at the upper surface and a lower surface, respectively, of the first nanostructure of the nanostructures, wherein the second value is a sum of a third thickness and a fourth thickness of the gate dielectric layer measured at the first sidewall and an opposing second sidewall, respectively, of the first nanostructure.

14. The method of claim 11, wherein the second semiconductor material has a first crystal orientation at the upper surface of the first nanostructure, and has a second crystal orientation at the first sidewall of the first nanostructure, wherein the second crystal orientation is different from the first crystal orientation.

15. The method of claim 12, wherein converting the exterior layer of the nanostructures comprises performing a remote plasma process to oxidize the exterior layer of the nanostructures with oxygen radicals, wherein an energy level of the oxygen radicals is below 2 eV.

16. The method of claim 11, wherein converting the exterior layer of the nanostructures comprises performing an in-situ steam generation (ISSG) process using a gas source comprising a hydrogen gas and an oxygen gas, wherein a flow rate of the hydrogen gas is between 0.1 standard liters per minute (slm) and 10 slm, a flow rate of the oxygen gas is between 20 slm and 29.9 slm, and a temperature of the ISSG process is between 550° C. and 850° C.

17. A nanostructure field-effect transistor (nano-FET) device comprising:
    a fin protruding above a substrate;
    source/drain regions over the fin;
    nanostructures between the source/drain regions and extending parallel to the substrate, wherein the nanostructures comprise a semiconductor material, wherein a first surface of a first nanostructure of the nanostructures has a first atomic density of the semiconductor material, and a second surface of the first nanostructure has a second atomic density of the semiconductor material different from the first atomic density;
    a gate dielectric layer around the nanostructure, wherein a conformality of the gate dielectric layer is larger than 99%; and
    a gate electrode around the gate dielectric layer.

18. The nano-FET device of claim 17, wherein the conformality of the gate dielectric layer is calculated as a ratio between a first value and a second value, wherein the first value is a sum of a first thickness and a second thickness of the gate dielectric layer measured at an upper surface and a lower surface, respectively, of the first nanostructure, wherein the second value is a sum of a third thickness and a fourth thickness of the gate dielectric layer measured at a first sidewall and an opposing second sidewall, respectively, of the first nanostructure.

19. The nano-FET device of claim 17, wherein the first atomic density is less than 75% of the second atomic density.

20. The nano-FET device of claim 17, wherein the first nanostructure has a chamfer between the first surface and the second surface, wherein the chamfer has a third atomic density of the semiconductor material different from the first and the second atomic densities.

* * * * *